United States Patent
Yokoi et al.

(10) Patent No.: US 8,946,790 B2
(45) Date of Patent: Feb. 3, 2015

(54) SEMICONDUCTOR DEVICE AND METHOD OF MANUFACTURING THE SAME

(75) Inventors: Tomokazu Yokoi, Kanagawa (JP); Yasumasa Yamane, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/488,791

(22) Filed: Jun. 5, 2012

(65) Prior Publication Data

US 2012/0313152 A1      Dec. 13, 2012

(30) Foreign Application Priority Data

Jun. 10, 2011   (JP) .................................. 2011-130367

(51) Int. Cl.
*H01L 21/20*  (2006.01)
*H01L 29/786*  (2006.01)
(Continued)

(52) U.S. Cl.
CPC ............ *H01L 21/20* (2013.01); *H01L 29/7869* (2013.01); *H01L 27/1225* (2013.01); *H01L 29/66742* (2013.01); *H01L 29/78618* (2013.01); *H01L 29/78693* (2013.01); *H01L 21/02554* (2013.01); *H01L 21/02565* (2013.01)
USPC .......................................... 257/288; 438/478

(58) Field of Classification Search
CPC ............ H01L 29/7869; H01L 27/1225; H01L 29/66742; H01L 29/78696; H01L 21/02565
USPC .............. 257/288, E29.255, E21.09; 438/478
IPC ........ H01L 27/1214, 29/04, 29/66765, 27/1225
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Park et al., "High performance amorphous oxide thin film transistors with self-aligned top-gate structure," IEDM 09: Technical Digest of International Electron Devices Meeting, Dec. 7, 2009, pp. 191-194.

(Continued)

*Primary Examiner* — Tony Tran
(74) *Attorney, Agent, or Firm* — Eric J. Robinson; Robinson Intellectual Property Law Office, P.C.

(57) ABSTRACT

A transistor which includes an oxide semiconductor and is capable of high-speed operation and a method of manufacturing the transistor. In addition, a highly reliable semiconductor device including the transistor and a method of manufacturing the semiconductor device. The semiconductor device includes an oxide semiconductor layer including a channel formation region, and a source and drain regions which are provided so that the channel formation region is interposed therebetween and have lower resistance than the channel formation region. The channel formation region and the source and drain regions each include a crystalline region.

12 Claims, 13 Drawing Sheets

(51) Int. Cl.
*H01L 27/12* (2006.01)
*H01L 29/66* (2006.01)
*H01L 21/02* (2006.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |
| 8,164,090 | B2 * | 4/2012 | Iwasaki et al. .................. 257/43 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0090215 | A1 | 4/2010 | Lee |
| 2010/0092800 | A1 | 4/2010 | Itagaki et al. |
| 2010/0109002 | A1 | 5/2010 | Itagaki et al. |
| 2010/0109058 | A1 | 5/2010 | Sakata et al. |
| 2010/0117073 | A1 | 5/2010 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-135774 A | 6/2010 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physical Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and SC2O3-A2O3-BO Systems [A; Fe, Ga, Or Al; B: Mg, Mn, Fe, Ni, Cu, Or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

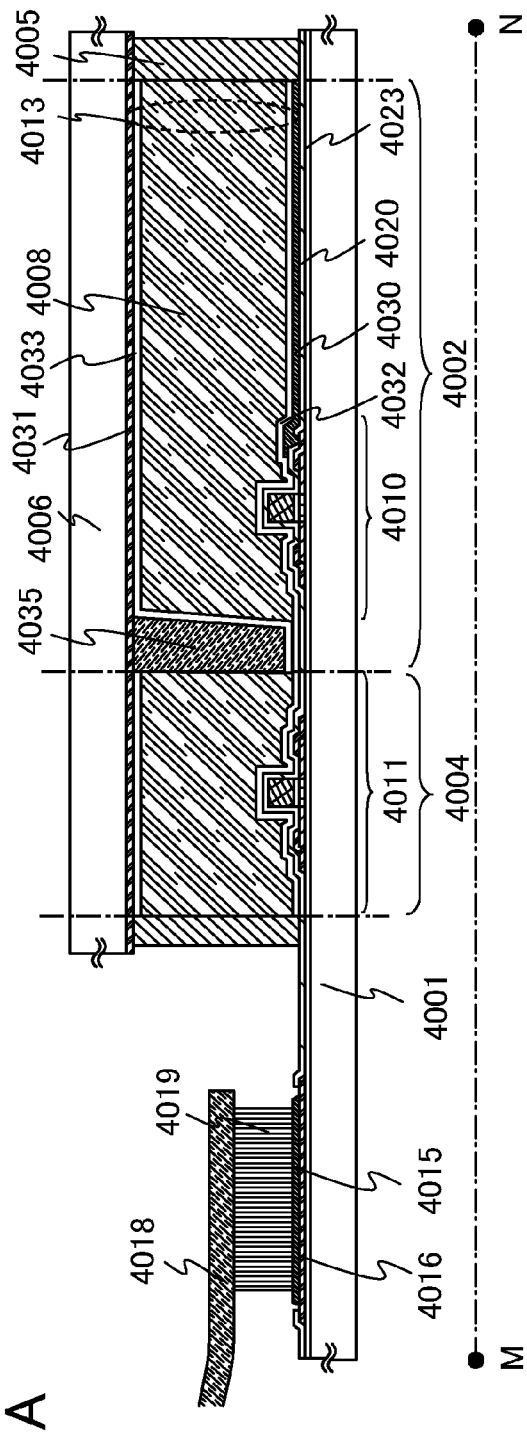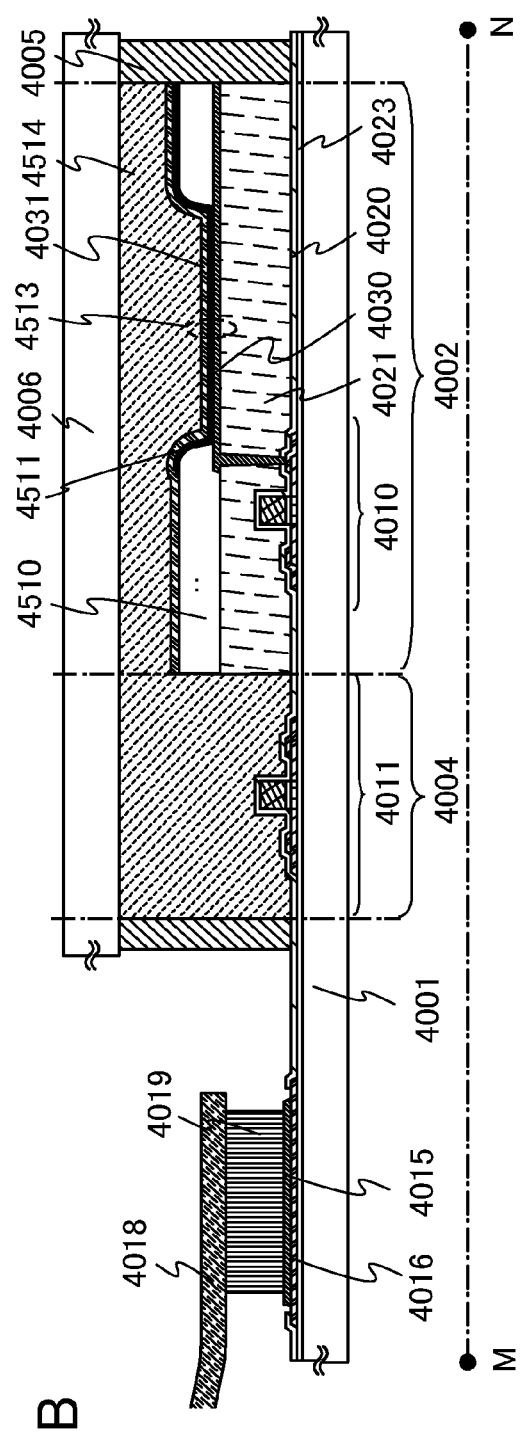

SEMICONDUCTOR DEVICE AND METHOD OF MANUFACTURING THE SAME

BACKGROUND OF THE INVENTION

1. Field of the Invention

The disclosed invention relates to a semiconductor device and a method of manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which a transistor is formed using a semiconductor thin film formed over a substrate with an insulating surface has been attracting attention. The transistor is applied to a wide range of semiconductor devices such as an integrated circuit (IC) and an image display device (also simply referred to as display device). A silicon-based semiconductor material is known as a material for a semiconductor thin film applicable to the transistor. As another material, an oxide semiconductor has been attracting attention.

For example, Patent Document 1 and Patent Document 2 disclose a technique by which a transistor is manufactured using zinc oxide or an In—Ga—Zn—O-based oxide as an oxide semiconductor and is used as a switching element or the like in a pixel of a display device.

Patent Document 3 discloses a technique by which, in a staggered transistor including an oxide semiconductor, a highly conductive oxide semiconductor containing nitrogen is provided as buffer layers between a source region and a source electrode and between a drain region and a drain electrode, and thereby the contact resistance between the oxide semiconductor and the source electrode and between the oxide semiconductor and the drain electrode is reduced.

Non-Patent Document 1 discloses a top-gate amorphous oxide semiconductor transistor in which a channel region, a source region, and a drain region are formed in a self-aligned manner.

[Reference]

[Patent Document 1] Japanese Published Patent Application No. 2007-123861

[Patent Document 2] Japanese Published Patent Application No. 2007-96055

[Patent Document 3] Japanese Published Patent Application No. 2010-135774

[Non-Patent Document] Jae Chul Park et al., "High performance amorphous oxide thin film transistors with self-aligned top-gate structure" IEDM2009, pp. 191-194

SUMMARY OF THE INVENTION

High-speed operation of a transistor is required with an improvement in performance of a semiconductor device including a transistor. In view of the above, an object of one embodiment of the present invention is to provide a transistor which includes an oxide semiconductor and can be operated at high speed and a method of manufacturing the transistor. Another object of one embodiment of the present invention is to provide a highly reliable semiconductor device including the transistor and a method of manufacturing the semiconductor device.

One embodiment of the disclosed invention is a semiconductor device which includes an oxide semiconductor layer including a channel formation region and a source and drain regions which are provided so that the channel formation region is interposed therebetween and have lower resistance than the channel formation region. The channel formation region, the source region, and the drain region each include a crystalline region. Specifically, for example, the structure described below can be employed.

Another embodiment of the present invention is a semiconductor device which includes a crystalline oxide semiconductor layer including a source region, a drain region, and a channel formation region; a gate insulating layer provided over the channel formation region; and a gate electrode provided over the channel formation region with the gate insulating layer positioned therebetween. The source region and the drain region are crystalline regions containing nitrogen.

Another embodiment of the present invention is a semiconductor device which includes a crystalline oxide semiconductor layer including a source region, a drain region, and a channel formation region; a gate insulating layer provided over the channel formation region; a gate electrode provided over the channel formation region with the gate insulating layer positioned therebetween; an insulating layer having openings and provided over the crystalline oxide semiconductor layer and the gate electrode; and a source electrode and a drain electrode respectively in contact with the source region and the drain region through the openings provided in the insulating layer. The source region and the drain region are crystalline regions containing nitrogen.

In any one of the above semiconductor devices, the source region and the drain region may have higher crystallinity than the channel formation region.

Another embodiment of the present invention is a method of manufacturing a semiconductor device including the steps of: forming a crystalline oxide semiconductor layer; forming a first insulating layer over the crystalline oxide semiconductor layer; forming a gate electrode over the crystalline oxide semiconductor layer with the first insulating layer positioned therebetween; forming a gate insulating layer by etching the first insulating layer with the gate electrode used as a mask; and forming a crystalline region containing nitrogen in the crystalline oxide semiconductor layer by performing nitrogen plasma treatment on part of the crystalline oxide semiconductor layer, which is not covered with the gate insulating layer.

Another embodiment of the present invention is a method of manufacturing a semiconductor device including the steps of: forming an oxide semiconductor layer; forming a first insulating layer over the oxide semiconductor layer; forming a crystalline oxide semiconductor layer by performing heat treatment on the oxide semiconductor layer; forming a gate electrode over the crystalline oxide semiconductor layer with the first insulating layer positioned therebetween; forming a gate insulating layer by etching the first insulating layer with the gate electrode used as a mask; and forming a crystalline region containing nitrogen in the crystalline oxide semiconductor layer by performing nitrogen plasma treatment on part of the crystalline oxide semiconductor layer, which is not covered with the gate insulating layer; forming a second insulating layer covering the crystalline oxide semiconductor layer and the gate electrode; forming openings in regions of the second insulating layer, which overlap with a source region and a drain region; and forming, over the second insulating layer, a source electrode and a drain electrode which are respectively in contact with the source region and the drain region through the openings.

In this specification and the like, the crystalline oxide semiconductor layer is an oxide semiconductor layer which includes crystals and has crystallinity. The crystals in the crystalline oxide semiconductor layer may have crystal axes oriented in random directions or in a certain direction.

In one embodiment of the invention disclosed in this specification, a c-axis aligned crystalline oxide semiconductor (CAAC-OS) film can be formed as the crystalline oxide semiconductor layer.

The CAAC-OS film is not completely single crystal nor completely amorphous. The CAAC-OS film is an oxide semiconductor film with a crystal-amorphous mixed phase structure where crystalline portions and amorphous portions are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, a grain boundary in the CAAC-OS film is not found with the TEM. Thus, a reduction in electron mobility due to the grain boundary is suppressed in the CAAC-OS film.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to an a-b plane is formed, and metal atoms are arranged in a layered manner or metal atoms and oxygen atoms are arranged in a layered manner when seen from the direction perpendicular to the c-axis. Note that among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the crystalline oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystalline portion is the direction parallel to a normal vector of the surface where the CAAC-OS film is formed or a normal vector of the surface of the CAAC-OS film. The crystal part is formed by deposition or by performing treatment for crystallization such as heat treatment after deposition.

Nitrogen may be substituted for part of oxygen included in the CAAC-OS film.

Such a crystalline oxide semiconductor layer is used in a transistor, whereby it is possible to obtain a highly reliable semiconductor device in which changes in the electrical characteristics of the transistor due to irradiation with visible light or ultraviolet light can be suppressed.

Note that the term such as "over" in this specification and the like does not necessarily mean that a component is placed "directly on" another component. For example, the expression "a gate electrode over a gate insulating layer" does not exclude the case where a component is placed between the gate insulating layer and the gate electrode. For example, in the case of a "gate electrode over a gate insulating layer", any other component may be provided between the gate insulating layer and the gate electrode. The same applies to the term "below".

In addition, in this specification and the like, the term "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

According to one embodiment of the present invention, a transistor which includes an oxide semiconductor and can be operated at high speed and a method of manufacturing the transistor can be provided.

According to one embodiment of the present invention, a highly reliable semiconductor device and a method of manufacturing the semiconductor device can be provided.

BRIEF DESCRIPTION OF THE DRAWINGS

FIGS. 7A and 7B are cross-sectional views each illustrating one embodiment of a semiconductor device.

DETAILED DESCRIPTION OF THE INVENTION

Figure 1A:
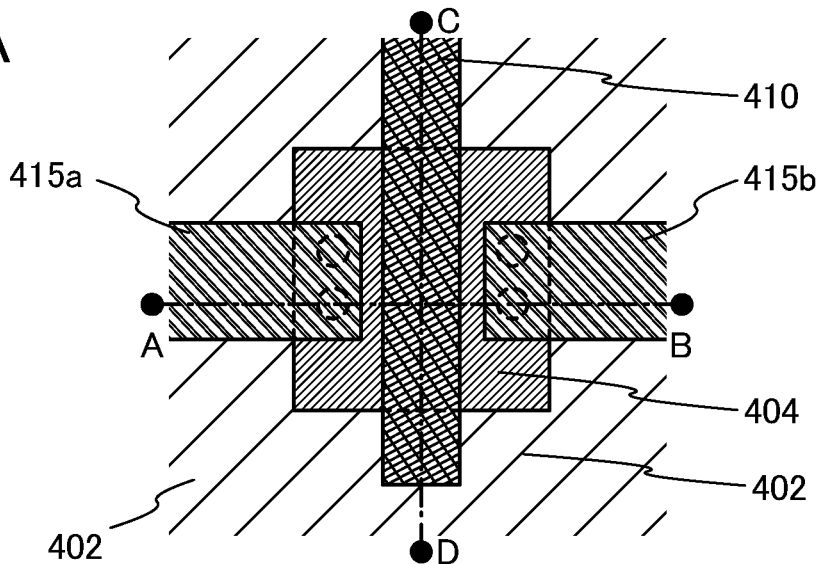
FIGS. 1A to 1C are a plan view and cross-sectional views illustrating one embodiment of a semiconductor device.

Hereinafter, embodiments of the present invention will be described in detail with reference to the accompanying drawings. Note that the present invention is not limited to the description below and it is easily understood by those skilled in the art that the mode and details can be changed in various ways. Therefore, the present invention should not be construed as being limited to the content of the embodiments below. Note that in the structures of the present invention described below, the same portions or portions having similar functions are denoted by the same reference numerals in common in different drawings and description thereof is not repeated. The same hatching pattern is used for portions having similar functions have, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps and the stacking order of layers. In addition, the ordinal numbers in this specification do not denote particular names which specify the present invention.

(Embodiment 1)

In this embodiment, one embodiment of a semiconductor device and a method of manufacturing the semiconductor device will be described with reference to FIGS. 1A to 1C and FIGS. 2A to 2E.

Figure 1B:
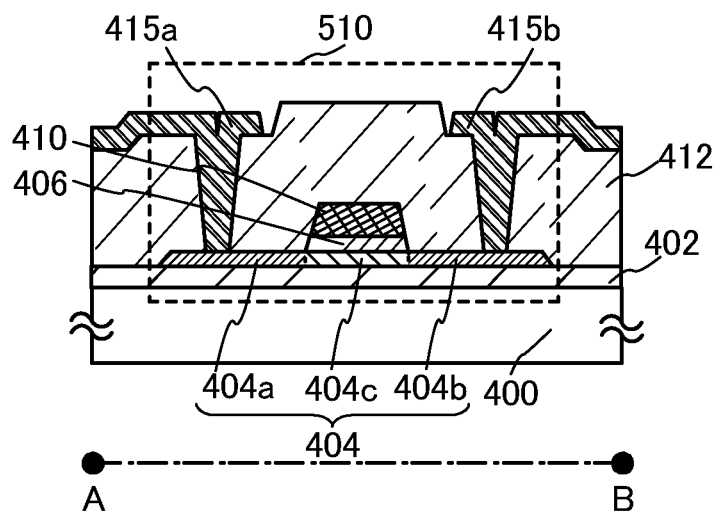
Figure 1C:
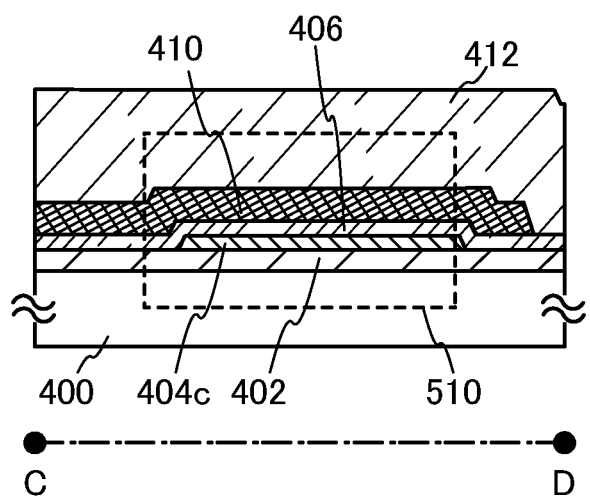

FIGS. 1A to 1C are a plan view and cross-sectional views which illustrate a transistor 510 as an example of a semiconductor device. FIG. 1A is a plan view, FIG. 1B is a cross-sectional view along A-B in FIG. 1A, and FIG. 1C is a cross-sectional view along C-D in FIG. 1A. Note that in FIG. 1A, some components of the transistor 510 (e.g., a gate insulating layer 412) are not illustrated for simplicity.

The transistor 510 illustrated in FIGS. 1A to 1C includes, over a substrate 400 with an insulating surface, a base insulating layer 402, a crystalline oxide semiconductor layer 404 including a source region 404a, a drain region 404b, and a channel formation region 404c, a gate insulating layer 406, a gate electrode 410, an insulating layer 412 having openings, a source electrode 415a which is in contact with the source region 404a through the opening in the insulating layer 412, and a drain electrode 415b which is in contact with the drain region 404b through the opening in the insulating layer 412. Note that the transistor 510 does not necessarily include the base insulating layer 402 and the insulating layer 412.

In the crystalline oxide semiconductor layer 404 provided in the transistor 510 illustrated in FIGS. 1A to 1C, the source region 404a and the drain region 404b are crystalline oxide semiconductor layers containing nitrogen and have lower resistance than the channel formation region 404c.

The source region 404a and the drain region 404b are formed as follows: after the crystalline oxide semiconductor layer 404 is formed, nitrogen is intentionally contained in the crystalline oxide semiconductor layer 404 by nitrogen plasma treatment. Thus, the source region 404a and the drain region 404b have higher carrier density than the channel formation region 404c. In such a region having high carrier density, the source electrode 415a or the drain electrode 415b formed of a metal is in contact with the crystalline oxide semiconductor layer 404, whereby the contact between the crystalline oxide semiconductor layer 404 and the source electrode 415a or the drain electrode 415b can be ohmic contact. In addition, the contact resistance therebetween can be reduced. As a result, the on-state current of the transistor 510 can be increased.

In this specification, low-resistance oxide semiconductor layers which function as source and drain regions have n-type conductivity and are also referred to as n$^+$ layers in some cases.

The source region 404a, the drain region 404b, and the channel formation region 404c in the crystalline oxide semiconductor layer 404 are each a region including crystals (also referred to as crystalline region). The crystals in the crystalline oxide semiconductor layer may have crystal axes oriented in random directions or in a certain direction.

The source region 404a, the drain region 404b, and the channel formation region 404c are each a crystalline region, so that favorable bonding between the source region 404a and the channel formation region 404c and between the drain region 404b and the channel formation region 404c can be obtained. Further, the source region 404a, the drain region 404b, and the channel formation region 404c are each a crystalline region, so that the level in the band gap of the crystalline oxide semiconductor layer 404 can be reduced. Therefore, the transistor characteristics can be improved. In addition, the reliability of the transistor 510 can be improved.

An example of a manufacturing process of the transistor 510 will be described below with reference to FIGS. 2A to 2E.

First, the base insulating layer 402 is formed over the substrate 400 with an insulating surface. There is no particular limitation on a substrate that can be used as the substrate 400 with an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate of silicon germanium or the like; an SOI substrate; or the like can be used as the substrate 400, or the substrate provided with a semiconductor element can be used as the substrate 400.

A flexible substrate may be used as the substrate 400. In the case of using a flexible substrate, a transistor including an oxide semiconductor film may be directly formed on the flexible substrate, or a transistor including an oxide semiconductor film may be formed over a different manufacturing substrate and then separated to be transferred to the flexible substrate. Note that in order to separate the transistor from the manufacturing substrate and transfer it to the flexible substrate, a separation layer may be provided between the manufacturing substrate and the transistor including the oxide semiconductor film.

The base insulating layer 402 can have a single-layer structure or a stacked structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer 402 preferably has a single-layer structure or a stacked structure including an oxide insulating film so that the oxide insulating film is in contact with an oxide semiconductor layer to be formed later. In this embodiment, as the base insulating layer 402, a silicon oxide film is formed by a plasma CVD method, a sputtering method, or the like.

The base insulating layer 402 preferably includes a region containing oxygen the proportion of which is higher than the stoichiometric proportion (hereinafter, also referred to as oxygen-excess region), in which case oxygen vacancies in the oxide semiconductor layer to be formed later can be filled with the excess oxygen contained in the base insulating layer 402. In the case of having a stacked structure, the base insulating layer 402 preferably includes an oxygen-excess region at least in a layer in contact with the oxide semiconductor layer. In order to provide the oxygen-excess region in the base insulating layer 402, for example, the base insulating layer 402 may be formed in an oxygen atmosphere. Alternatively, the oxygen-excess region may be formed by implanting oxygen (including at least one of an oxygen radical, an oxygen atom, and an oxygen ion) into the base insulating layer 402 after its formation. Oxygen can be implanted by an ion implantation method, an ion doping method, a plasma immersion ion implantation method, plasma treatment, or the like.

Next, an oxide semiconductor layer with a thickness greater than or equal to 2 nm and less than or equal to 200 nm, preferably greater than or equal to 5 nm and less than or equal to 30 nm, is formed over the base insulating layer 402.

The oxide semiconductor layer formed over the base insulating layer 402 may have an amorphous structure or may be a crystalline oxide semiconductor. Note that in the case where the oxide semiconductor layer has an amorphous structure, a crystalline oxide semiconductor is formed by performing heat treatment on the oxide semiconductor layer in a later manufacturing step (at least no later than the step of the nitrogen plasma treatment). The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., even more preferably higher than or equal to 550° C. Note that the heat treatment can also serve as another heat treatment in the manufacturing process.

Figure 2A:
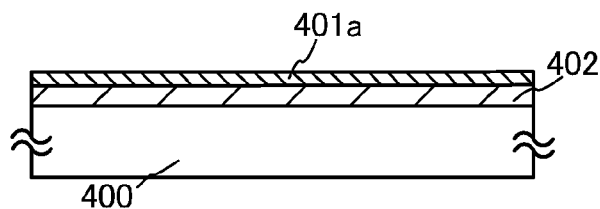
FIGS. 2A to 2E illustrate an example of a manufacturing process of a semiconductor device.

In this embodiment, a crystalline oxide semiconductor layer 401a is formed over the base insulating layer 402 (see FIG. 2A).

The crystalline oxide semiconductor layer 401a can be formed by a sputtering method, a molecular beam epitaxy (MBE) method, a CVD method, a pulse laser deposition method, an atomic layer deposition (ALD) method, or the like as appropriate.

In the formation of the crystalline oxide semiconductor layer 401a, the concentration of hydrogen contained in the crystalline oxide semiconductor layer 401a is preferably reduced as much as possible. For example in the case where the crystalline oxide semiconductor layer 401a is formed by a sputtering method, in order to reduce the hydrogen concentration, a high-purity rare gas (typically argon), high-purity oxygen, or a high-purity mixed gas of a rare gas and oxygen, from which impurities such as hydrogen, water, a hydroxyl group, and hydride are removed, is supplied as an atmosphere gas into a treatment chamber of a sputtering apparatus as appropriate.

The oxide semiconductor layer is formed in such a manner that a sputtering gas from which hydrogen and moisture are removed is introduced into a deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with an entrapment vacuum pump such as a cryopump, a hydrogen atom, a compound containing a hydrogen atom, such as water ($H_2O$), (more preferably, also a compound containing a carbon atom), and the like are removed, whereby the concentration of impurities contained in the crystalline oxide semiconductor layer 401a formed in the deposition chamber can be reduced.

The base insulating layer 402 and the crystalline oxide semiconductor layer 401a are preferably formed in succession without being exposed to the air. When the base insulating layer 402 and the crystalline oxide semiconductor layer 401a are formed in succession without being exposed to the air, impurities such as hydrogen and moisture can be prevented from being adsorbed onto a surface of the base insulating layer 402.

In order to reduce the concentration of impurities contained in the crystalline oxide semiconductor layer 401a, it is also effective to form the crystalline oxide semiconductor layer 401a with the substrate 400 kept at a high temperature.

The temperature at which the substrate 400 is heated may be higher than or equal to 150° C. and lower than or equal to 450° C.; the substrate temperature is preferably higher than or equal to 200° C. and lower than or equal to 350° C. The crystalline oxide semiconductor layer can be formed by heating the substrate at a high temperature in the formation.

An oxide semiconductor to be used in the crystalline oxide semiconductor layer 401a preferably contains at least indium (In) or zinc (Zn). In particular, In and Zn are preferably contained. As a stabilizer for reducing variation in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In to Ga and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. For example, r may be 0.05. The same applies to other oxides.

Note that it is preferable that the crystalline oxide semiconductor layer 401a be formed under a condition that much oxygen is contained during formation (e.g., formed by a sputtering method in a 100% oxygen atmosphere), so that a film containing much oxygen (preferably including a region where the oxygen content is higher than that in the stoichiometric proportion of the oxide semiconductor in a crystalline state) is formed.

The target used for formation of the oxide semiconductor layer by a sputtering method is, for example, a metal oxide target having a composition ratio of $In_2O_3:Ga_2O_3:ZnO=1:1:2$ [molar ratio], so that an In—Ga—Zn—O film is formed. Without limitation to the material and the composition of the above target, for example, a metal oxide target having a composition ratio of $In_2O_3:Ga_2O_3:ZnO=1:1:1$ [molar ratio] may be used.

The filling rate of the metal oxide target is higher than or equal to 90% and lower than or equal to 100%, preferably higher than or equal to 95% and lower than or equal to 99.9%. With the use of a metal oxide target with a high filling rate, the formed oxide semiconductor layer can have high density.

In this embodiment, the crystalline oxide semiconductor layer 401a is formed by a sputtering method with the use of an In—Ga—Zn-based metal oxide target. The crystalline oxide semiconductor layer 401a that is an oxide semiconductor layer including a crystalline region can be formed under the following conditions: the atmosphere is a rare gas (typically argon) atmosphere, an oxygen atmosphere, or a mixed atmosphere of a rare gas and oxygen and the film formation temperature is higher than or equal to 200° C. and lower than or equal to 450° C.

As the oxide semiconductor layer including a crystalline region, for example, a CAAC-OS film can be used. There are three methods of obtaining the CAAC-OS film. The first method is to form an oxide semiconductor layer at a film formation temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

In the crystalline oxide semiconductor layer 401a, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, Ra is obtained by expanding arithmetic mean surface roughness, which is defined by JIS B 0601: 2001 (ISO 4287: 1997), into three dimensions so as to be applied to a curved surface. The Ra can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Further, Ra can be measured with an atomic force microscope (AFM).

Thus, planarization treatment may be performed on a region in the base insulating layer 402, which is to be in contact with the crystalline oxide semiconductor layer 401a. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the base insulating layer 402.

It is preferable to perform heat treatment for removing excess hydrogen (including water and a hydroxyl group) contained in the crystalline oxide semiconductor layer 401a (for performing dehydration or dehydrogenation) after the formation of the crystalline oxide semiconductor layer 401a. The temperature of the heat treatment is typically higher than or equal to 200° C. and lower than the strain point of the substrate 400, preferably higher than or equal to 250° C. and lower than or equal to 450° C.

Hydrogen, which is an n-type impurity, can be removed from the oxide semiconductor by the heat treatment. For example, the concentration of hydrogen contained in the crystalline oxide semiconductor layer 401a after the dehydration or dehydrogenation treatment can be lower than or equal to $5 \times 10^{19}/cm^3$, preferably lower than or equal to $5 \times 10^{18}/cm^3$.

Note that the heat treatment for dehydration or dehydrogenation may be performed anytime in the manufacturing process of the transistor 510 as long as it is performed after the formation of the crystalline oxide semiconductor layer 401a before the nitrogen plasma treatment. Note that the heat treatment for dehydration or dehydrogenation is preferably performed before the crystalline oxide semiconductor layer 401a is processed into an island shape, in which case release of oxygen contained in the base insulating layer 402 by the heat treatment can be prevented.

Note that it is preferable that water, hydrogen, and the like be not contained in a rare gas such as helium, neon, or argon in the heat treatment. The purity of nitrogen or a rare gas such as helium, neon, or argon which is introduced into the heat treatment apparatus is set to preferably 6N (99.9999%) or higher, more preferably 7N (99.99999%) or higher (i.e., the impurity concentration is 1 ppm or lower, preferably 0.1 ppm or lower).

In addition, after the crystalline oxide semiconductor layer 401a is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like be not contained in the oxygen gas or the dinitrogen monoxide gas. The purity of the oxygen gas or the dinitrogen monoxide gas which is introduced into the heat treatment apparatus is preferably 6N or more, more preferably 7N or more (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen which is a main component of the oxide semiconductor and is reduced by the step for removing an impurity for the dehydration or dehydrogenation, so that the crystalline oxide semiconductor layer 401a can be a purified, i-type (intrinsic) crystalline oxide semiconductor layer.

Next, the crystalline oxide semiconductor layer 401a is processed into an island-shaped oxide semiconductor layer 401 in a photolithography process. A resist mask used for forming the island-shaped crystalline oxide semiconductor layer 401 may be formed by an inkjet method. Formation of the resist mask by an inkjet method needs no photomask; thus, the manufacturing cost of the semiconductor device can be reduced.

Figure 2B:
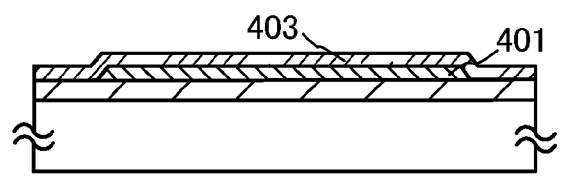

Next, an insulating layer 403 is formed over the island-shaped crystalline oxide semiconductor layer 401 by a plasma CVD method, a sputtering method, or the like (see FIG. 2B). The insulating layer 403 is a layer which is to be patterned in a later step to serve as a gate insulating layer. The insulating layer 403 can be formed using a silicon oxide film, a gallium oxide film, an aluminum oxide film, a silicon nitride film, a silicon oxynitride film, an aluminum oxynitride film, or a silicon nitride oxide film.

The insulating layer 403 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced.

The insulating layer 403 may have a single-layer structure or a stacked structure; an oxide insulating film is preferably used as a film to be in contact with the crystalline oxide semiconductor layer 401. In this embodiment, an insulating layer having a structure in which a silicon oxide film and an aluminum oxide film are stacked in this order on the side in contact with the crystalline oxide semiconductor layer 401 is used as the insulating layer 403. The aluminum oxide film has a high effect of blocking both oxygen and impurities such as hydrogen and moisture passing therethrough (i.e., blocking effect), and thus is preferably used because release of oxygen from the crystalline oxide semiconductor layer 401 can be prevented.

The insulating layer 403 preferably includes an oxygen-excess region, in which case oxygen vacancies in the crystalline oxide semiconductor layer can be filled with excess oxygen contained in the insulating layer 403. In order to provide the oxygen-excess region in the insulating layer 403, for example, the insulating layer 403 may be formed in an oxygen atmosphere. Alternatively, the oxygen-excess region may be formed by implanting oxygen (including at least one of an oxygen radical, an oxygen atom, and an oxygen ion) into the insulating layer 403 after its formation.

Note that the oxygen-excess region may be formed in the crystalline oxide semiconductor layer 401 by implanting oxygen into the crystalline oxide semiconductor layer 401 before the formation of the insulating layer 403 or from above the insulating layer 403. When oxygen is implanted into the crystalline oxide semiconductor layer 401 through a film stacked over the crystalline oxide semiconductor layer 401, the depth at which oxygen is implanted (implanted region) can be controlled more easily; thus, an advantage that oxygen can be sufficiently implanted into the crystalline oxide semiconductor layer 401 can be obtained. In contrast, when oxygen is implanted into the crystalline oxide semiconductor layer 401 with the crystalline oxide semiconductor layer 401 exposed, the planarity of a surface of the crystalline oxide semiconductor layer 401 can be improved.

The depth in the crystalline oxide semiconductor layer 401 at which oxygen is implanted may be controlled by setting implantation conditions such as acceleration voltage and a dose, and the thickness of the insulating layer 403 through which the oxygen passes, as appropriate. It is preferable that the amount of oxygen contained in the crystalline oxide semiconductor layer 401 exceed that in the stoichiometric proportion by the oxygen implantation treatment. For example, a peak of the concentration of oxygen in the crystalline oxide semiconductor layer 401, which is introduced by the oxygen implantation treatment, is preferably higher than or equal to $1 \times 10^{18}/cm^3$ and lower than or equal to $5 \times 10^{21}/cm^3$.

It is preferable to perform heat treatment after the formation of the insulating layer 403 in the case where an oxide insulating film is formed as the insulating layer 403, or in the case where the insulating layer 403 has an oxygen-excess region. The heat treatment is performed at a temperature, for example, higher than or equal to 250° C. and lower than or equal to 450° C. The heat treatment may be performed in an atmosphere of nitrogen, oxygen, ultra-dry air, or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

This heat treatment makes it possible to supply oxygen, which is one of main components of the oxide semiconductor and is reduced due to the heat treatment for dehydration or dehydrogenation, from an insulating layer containing oxygen (insulating layer 403 in FIG. 2B) to the crystalline oxide semiconductor layer 401. Thus, the crystalline oxide semiconductor layer 401 can be purified and become an i-type (intrinsic) semiconductor. The oxygen-excess region is formed in the crystalline oxide semiconductor layer 401, whereby oxygen vacancies can be filled; thus, charge trapping centers in the crystalline oxide semiconductor layer 401 can be reduced. Note that the timing of the heat treatment is not limited to that described in this embodiment.

There is an oxygen vacancy in a portion in the crystalline oxide semiconductor layer, from which oxygen is removed, and the oxygen vacancy causes a donor level which causes a variation in the electrical characteristics of a transistor. For that reason, oxygen is preferably supplied to the crystalline oxide semiconductor layer 404 which has been subjected to the dehydration or dehydrogenation treatment, in which case the oxygen vacancy in the layer can be filled. By using such a crystalline oxide semiconductor layer in a transistor, a variation in the threshold voltage $V_{th}$ of the transistor and a shift (variation) of the threshold voltage due to the oxygen vacancy can be reduced. In addition, the threshold voltage of the transistor can be positively shifted to make the transistor a normally-off transistor.

When oxygen implantation treatment is performed on the crystalline oxide semiconductor layer 401, a crystalline structure included in the oxide semiconductor layer might be disordered to be an amorphous structure. However, the crystalline structure can be recovered by performing the heat treatment for filling oxygen vacancies.

Next, a conductive film which is to be a gate electrode (including a wiring formed from the same layer as the gate electrode) is formed over the gate insulating layer 406 and is processed, so that the gate electrode 410 is formed. The gate electrode 410 can be formed by a plasma CVD method, a sputtering method, or the like with the use of a metal material such as molybdenum, titanium, tantalum, tungsten, aluminum, copper, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used for the gate electrode 410. The gate electrode 410 may have a single-layer structure or a stacked structure.

Figure 2C:
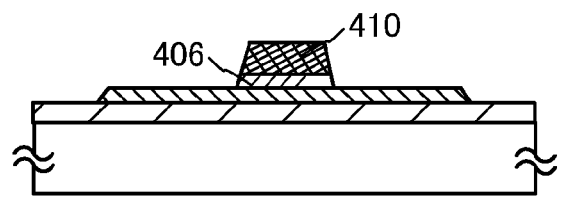
Figure 2D:
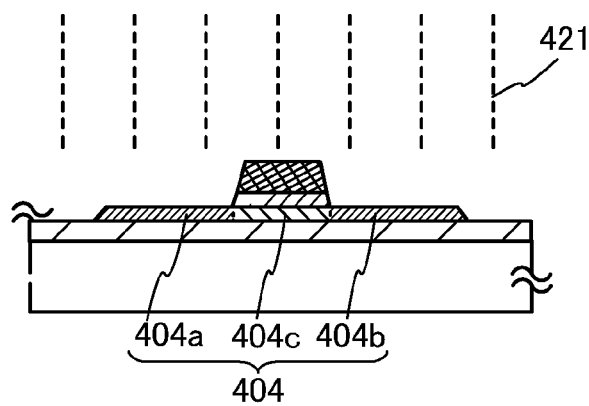
Figure 2E:
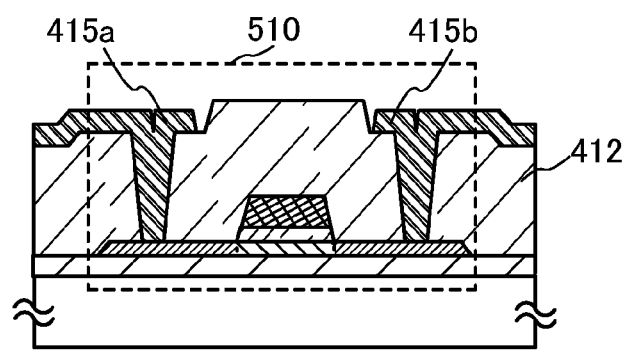

Next, the insulating layer 403 is etched using the gate electrode 410 as a mask to form the gate insulating layer 406 and expose parts of the crystalline oxide semiconductor layer 401 (regions which do not overlap with the gate electrode 410) (see FIG. 2C).

Next, the exposed regions of the crystalline oxide semiconductor layer 404 are irradiated with nitrogen plasma 421. By this nitrogen plasma treatment, parts of the crystalline oxide semiconductor layer 404 that are the exposed regions are nitrided, so that the crystalline oxide semiconductor layer 404 including the n-type source region 404a, the n-type drain region 404b, and the channel formation region 404c is formed (see FIG. 2D). Here, the channel formation region 404c interposed between the source region 404a and the drain region 404b is not exposed to the nitrogen plasma 421, and thus is an i-type or substantially i-type crystalline oxide semiconductor layer.

The nitrogen plasma treatment can be performed with, for example, a high-density plasma treatment apparatus. An example of the nitrogen plasma treatment with a high-density plasma treatment apparatus is described below. A mixed gas of nitrogen and a rare gas is supplied to a plasma treatment chamber, and then microwaves are introduced into the plasma treatment chamber to generate plasma of the mixed gas of nitrogen and a rare gas. In this plasma, the rare gas is excited by the introduced microwaves to generate rare gas radicals, and the rare gas radicals collide with nitrogen molecules to generate nitrogen radicals. Then, the nitrogen radicals generated in the plasma react with a metal element or oxygen contained in the exposed regions of the crystalline oxide semiconductor layer, whereby the regions of the crystalline oxide semiconductor layer are nitrided.

Note that the gas that can be used for the nitrogen plasma treatment is not limited to the above mixed gas, and a mixed gas of nitrogen, hydrogen, and a rare gas, a mixed gas of $NH_3$ and a rare gas, or the like can be used as appropriate. In plasma of these mixed gas, nitrogen radicals and NH radicals are generated, and part of the crystalline oxide semiconductor layer is nitrided by these radicals.

The heating temperature for the nitrogen plasma treatment can be in the range of 100° C. to 550° C. Note that the heating temperature for the nitrogen plasma treatment is preferably relatively high (e.g., higher than or equal to 450° C.), in which case the resistance of the source region 404a and the drain region 404b can be further reduced.

The nitrogen plasma treatment is treatment in which a crystalline oxide semiconductor layer is hardly damaged and a neutral atom or a neutral molecule with high reactivity is bonded to a metal element contained in the crystalline oxide semiconductor layer. The nitrogen plasma treatment makes it possible to improve the crystallinity of the crystalline oxide semiconductor layer. Thus, a crystalline oxynitride semiconductor layer or a crystalline nitride semiconductor layer is formed as the source region 404a and the drain region 404b (at least vicinities of surfaces of the regions) formed by the treatment, and these regions have higher crystallinity than the channel formation region 404c. Note that a surface of the gate electrode 410 can also be nitrided by the nitrogen plasma treatment.

For example, in the case where an In—Ga—Zn—O film is used as the crystalline oxide semiconductor layer 144, Zn and/or oxygen are/is replaced with nitrogen in the vicinity of a surface of the In—Ga—Zn—O film (e.g., about 5 nm from the surface) by the nitrogen plasma treatment, so that an In—Ga—Zn—O—N film is formed.

The source region 404a and the drain region 404b are formed by adding nitrogen to the crystalline oxide semiconductor layer 401 with the gate electrode 410 used as a mask. The source region 404a and the drain region 404b are formed with the gate electrode 410 used as a mask, whereby the source region 404a and the drain region 404b do not overlap with the gate electrode 410. Thus, unnecessary parasitic capacitance can be reduced, which results in high-speed operation of the transistor 510 to be manufactured.

Next, the insulating layer 412 covering the crystalline oxide semiconductor layer 404 and the gate electrode 410 is formed, and openings (also referred to as contact holes) are formed in regions in the insulating layer 412, which overlap with the source region 404a and the drain region 404b. After that, the source electrode 415a and the drain electrode 415b which are electrically connected to the source region 404a and the drain region 404b, respectively, through the contact holes are formed (see FIG. 2E). Through the above steps, the transistor 510 can be manufactured.

Note that although not illustrated, in some cases, parts of the crystalline oxide semiconductor layer 404 (parts of the source region 404a and the drain region 404b) are etched in the formation of the contact holes, so that the crystalline oxide semiconductor layer 404 has depressions.

The insulating layer 412 may be formed with a single layer or a stacked layer using one or more of silicon oxide, silicon oxynitride, silicon nitride oxide, silicon nitride, aluminum oxide, and aluminum nitride by a sputtering method, a CVD method, or the like. At this time, it is preferable to use a material from which oxygen is less likely to be released by heating. This is for preventing a reduction in the conductivity of the source region 404a and the drain region 404b. Specifically, for example, the insulating layer 412 may be formed by a CVD method with the use of a mixture which contains a silane gas as a main material and a proper source gas selected from a nitrogen oxide gas, a nitrogen gas, a hydrogen gas, and a rare gas. The substrate temperature may be set to higher than or equal to 300° C. and lower than or equal to 550° C. By using a CVD method, a film from which oxygen is less likely to be released by heating can be formed. A silane gas is used as a main material, so that hydrogen remains in the insulating layer and is diffused therein; thus, the conductivity of the source region 404a and the drain region 404b can be further increased. The concentration of hydrogen in the insulating layer 412 may be higher than or equal to 0.1 at. % and lower than or equal to 25 at. %.

The source electrode 415a and the drain electrode 415b can be formed with a single layer or a stacked layer using a metal material such as molybdenum, titanium, tantalum, tungsten, aluminum, copper, neodymium, or scandium, or an alloy material which contains any of these materials as a main component by a plasma CVD method, a sputtering method, or the like.

The transistor 510 described in this embodiment includes the source region 404a and the drain region 404b in regions in the crystalline oxide semiconductor layer 404, which are in contact with the source electrode 415a and the drain electrode 415b. By this structure, the contact between the crystalline oxide semiconductor layer 404 and the source electrode 415a or the drain electrode 415b can be ohmic contact, and thermally stable operation as compared to the case of Schottky junction can be obtained. In addition, the contact resistance therebetween can be reduced. As a result, the on-state current of the transistor 510 can be increased.

In addition, it is important to provide the source region 404a and the drain region 404b in order to supply carriers to the channel (on the source side), to stably absorb carriers from the channel (on the drain side), or to prevent a resistance component from being formed at an interface with the source electrode (or the drain electrode). Further, providing an n+ layer makes it possible to keep good mobility even at high drain voltage.

The structures, methods, and the like described in this embodiment can be combined as appropriate with any of the structures, methods, and the like described in the other embodiments.

(Embodiment 2)

In this embodiment, a semiconductor device which is one embodiment of the present invention and is different from that in Embodiment 1 and a method of manufacturing the semiconductor device will be described with reference to FIGS. 3A and 3B, FIGS. 4A and 4B, and FIGS. 5A to 5D. Note that the same portions as Embodiment 1 or portions having functions similar to those in Embodiment 1 can be formed as in Embodiment 1, and the same steps as Embodiment 1 or steps similar to those in Embodiment 1 can be performed as in Embodiment 1; therefore, description thereof is not repeated.

Figure 3A:
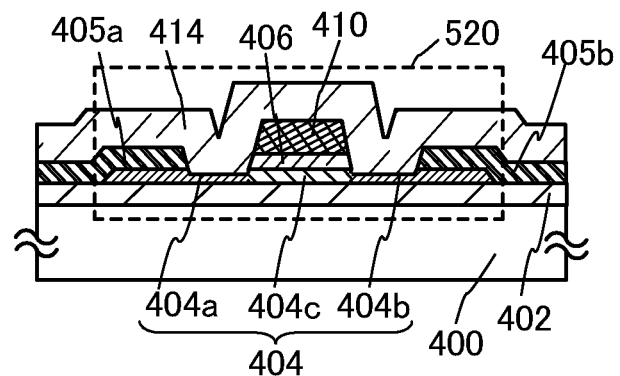
FIGS. 3A and 3B are cross-sectional views each illustrating one embodiment of a semiconductor device.

FIG. 3A is a cross-sectional view of a transistor 520 described as an example of the semiconductor device. The transistor 520 illustrated in FIG. 3A includes, over the substrate 400 with an insulating surface, the base insulating layer 402; the crystalline oxide semiconductor layer 404 including the source region 404a, the drain region 404b, and the channel formation region 404c; the gate insulating layer 406; the gate electrode 410; a source electrode 405a which is in contact with the crystalline oxide semiconductor layer 404 in the source region 404a; a drain electrode 405b which is in contact with the crystalline oxide semiconductor layer 404 in the drain region 404b; and an insulating layer 414 which covers the source electrode 405a, the drain electrode 405b, and the crystalline oxide semiconductor layer 404. Note that the transistor 520 does not necessarily include the base insulating layer 402 and the insulating layer 414.

Figure 3B:
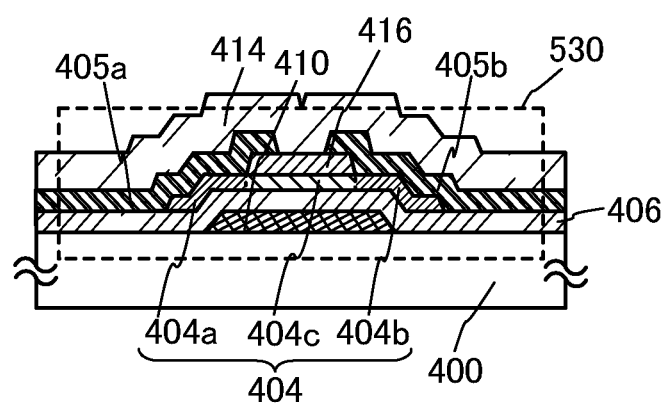

FIG. 3B is a cross-sectional view of a transistor 530 described as another example of the semiconductor device. The transistor 530 illustrated in FIG. 3B includes, over the substrate 400 with an insulating surface, the gate electrode 410, the gate insulating layer 406, the crystalline oxide semiconductor layer 404 including the source region 404a, the drain region 404b, and the channel formation region 404c, a channel protective layer 416 provided over the channel formation region 404c, the source electrode 405a which is in contact with the crystalline oxide semiconductor layer 404 in the source region 404a, the drain electrode 405b which is in contact with the crystalline oxide semiconductor layer 404 in the drain region 404b, and the insulating layer 414 which covers the source electrode 405a, the drain electrode 405b, and the channel protective layer 416. Note that the transistor 530 does not necessarily include the channel protective layer 416 and the insulating layer 414.

An example of a manufacturing process of the transistor 520 will be described below with reference to FIGS. 4A and 4B.

First, through the steps shown in FIGS. 2A to 2D, the base insulating layer 402 over the substrate 400, the crystalline oxide semiconductor layer 404 over the base insulating layer 402, which includes the source region 404a, the drain region 404b, and the channel formation region 404c, the gate insulating layer 406 on and in contact with the channel formation region 404c, and the gate electrode 410 over the channel formation region 404c with the gate insulating layer 406 positioned therebetween are formed.

Figure 4A:
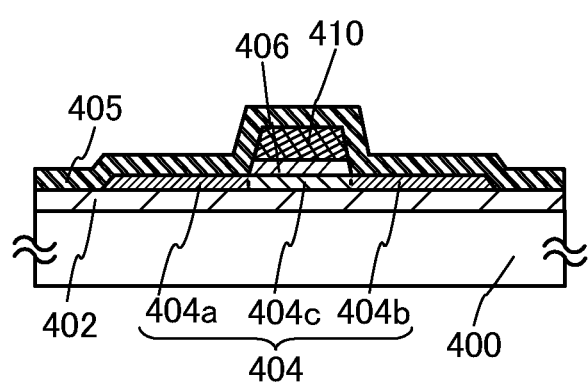
FIGS. 4A and 4B are cross-sectional views illustrating an example of a manufacturing process of a semiconductor device.
Figure 4B:
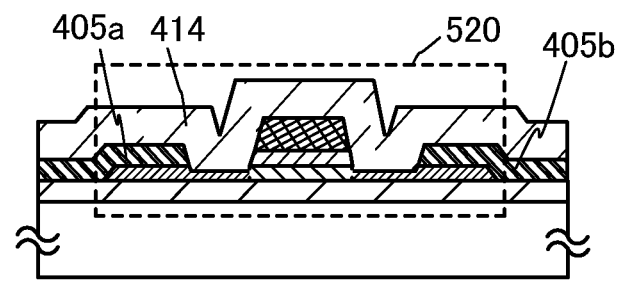

Next, a conductive film 405 which is to be the source electrode 405a and the drain electrode 405b (including a wiring formed from the same layer as the electrodes) is formed over the crystalline oxide semiconductor layer 404 and the gate electrode 410 (see FIG. 4A).

The conductive film 405 can be formed using a material and a method similar to those of the source electrode 415a and the drain electrode 415b.

Then, the conductive film 405 is processed in a photolithography process to form the source electrode 405a and the drain electrode 405b. Note that a resist mask for processing the conductive film 405 may be formed by an inkjet method. Formation of the resist mask by an inkjet method needs no photomask; thus, the manufacturing cost of the semiconductor device can be reduced.

Note that the material and etching conditions are adjusted as appropriate so that the crystalline oxide semiconductor layer 404 is not removed as much as possible in etching of the conductive film 405. Note that depending on the etching conditions, parts of exposed regions of the crystalline oxide semiconductor layer 404 (regions which are not in contact with the gate electrode 410, the source electrode 405a, and the drain electrode 405b) might be etched to be groove portions (depressions).

Next, the insulating layer 414 which covers the source electrode 405a, the drain electrode 405b, and the crystalline oxide semiconductor layer 404 is formed. Through the above steps, the transistor 520 can be manufactured (see FIG. 4B).

The insulating layer 414 can be formed using a material and a method similar to those of the insulating layer 412.

An example of a manufacturing process of the transistor 530 will be described below with reference to FIGS. 5A to 5D.

First, a conductive film which is to be a gate electrode (including a wiring formed from the same layer as the gate electrode) is formed over the substrate 400 with an insulating surface and is processed to form the gate electrode 410. Then, the gate insulating layer 406 which covers the gate electrode 410 is formed. It is preferable that the gate insulating layer 406 include an oxygen-excess region.

Figure 5A:
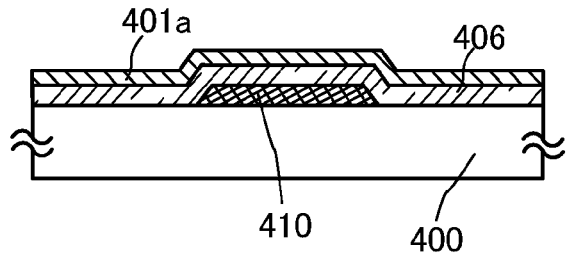
FIGS. 5A to 5D are cross-sectional views illustrating an example of a manufacturing process of a semiconductor device.
Figure 5B:
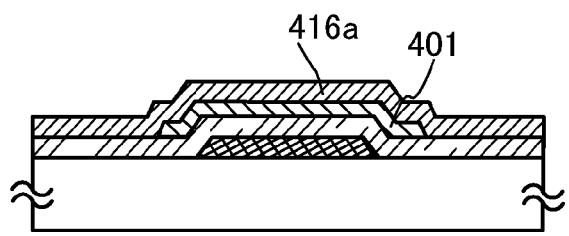
Figure 5C:
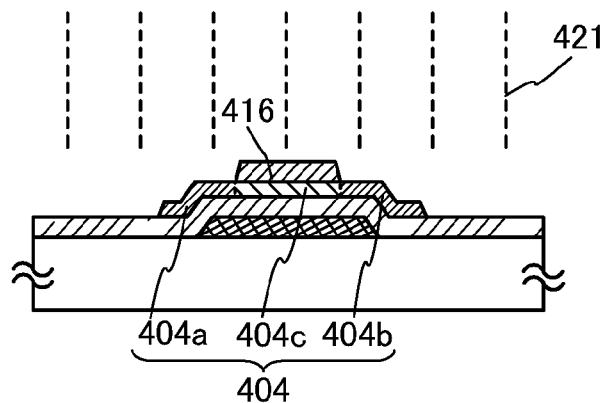
Figure 5D:
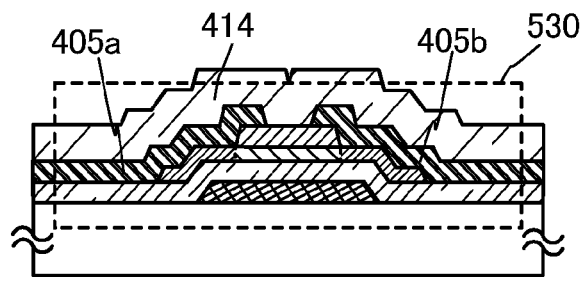

Next, the crystalline oxide semiconductor layer 401*a* is formed over the gate insulating layer 406 (see FIG. 5A). Note that the gate insulating layer 406 and the crystalline oxide semiconductor layer 401*a* are preferably formed in succession without being exposed to the air. When the gate insulating layer 406 and the crystalline oxide semiconductor layer 401*a* are formed in succession without being exposed to the air, impurities such as hydrogen and moisture can be prevented from being adsorbed onto a surface of the gate insulating layer 406.

It is preferable to perform heat treatment for removing excessive hydrogen (including water and a hydroxyl group) contained in the crystalline oxide semiconductor layer 401*a* (for performing dehydration or dehydrogenation) after the formation of the crystalline oxide semiconductor layer 401*a*. Note that the heat treatment for dehydration or dehydrogenation may be performed anytime in the manufacturing process of the transistor 530 as long as it is performed after the formation of the crystalline oxide semiconductor layer 401*a* before nitrogen plasma treatment. Note that the heat treatment for dehydration or dehydrogenation is preferably performed before the crystalline oxide semiconductor layer 401*a* is processed into an island shape, in which case release of oxygen contained in the gate insulating layer 406 by the heat treatment can be prevented.

After the crystalline oxide semiconductor layer 401*a* is heated by the heat treatment, a high-purity oxygen gas, a high-purity dinitrogen monoxide gas, or ultra-dry air may be introduced into the same furnace. The oxygen gas or the dinitrogen monoxide gas acts to supply oxygen which is a main component of the oxide semiconductor and is reduced by the step of removing an impurity for the dehydration or dehydrogenation, so that the crystalline oxide semiconductor layer 401*a* can be a purified, i-type (intrinsic) crystalline oxide semiconductor layer.

Next, the crystalline oxide semiconductor layer 401*a* is processed into an island-shaped crystalline oxide semiconductor layer 401 in a photolithography process. After that, an insulating layer 416*a* is formed over the island-shaped crystalline oxide semiconductor layer 401 (see FIG. 5B). The insulating layer 416*a* is to be patterned in a later step to serve as the channel protective layer 416.

The insulating layer 416*a* can be formed using a material and a method similar to those of the insulating layer 403. Note that the insulating layer 416*a* preferably has a single-layer structure or a stacked structure which includes an oxide insulating film so that the oxide insulating film is in contact with the crystalline oxide semiconductor layer 401.

The insulating layer 416*a* preferably includes an oxygen-excess region, in which case oxygen vacancies in the crystalline oxide semiconductor layer 401 can be filled with excess oxygen contained in the insulating layer 416*a*. In the case of having a stacked structure, the insulating layer 416*a* preferably includes an oxygen-excess region at least in a layer in contact with the crystalline oxide semiconductor layer 401. In order to provide the oxygen-excess region in the insulating layer 416*a*, for example, the insulating layer 416*a* may be formed in an oxygen atmosphere. Alternatively, the oxygen-excess region may be formed by implanting oxygen into the insulating layer 416*a* after its formation.

Note that the oxygen-excess region may be formed in the crystalline oxide semiconductor layer 401 by implanting oxygen into the crystalline oxide semiconductor layer 401 before the formation of the insulating layer 416*a* or from above the insulating layer 416*a*.

Heat treatment is performed after the formation of the insulating layer 416*a* in the case where an oxide insulating film is formed as the insulating layer 416*a*, or in the case where the insulating layer 416*a* has an oxygen-excess region. This heat treatment makes it possible to supply oxygen, which is one of main components of the oxide semiconductor and is reduced due to the heat treatment for dehydration or dehydrogenation, from an insulating layer containing oxygen (insulating layer 416*a* in FIG. 5B) to the crystalline oxide semiconductor layer 401. Thus, the crystalline oxide semiconductor layer 401 can be purified and become an i-type (intrinsic) semiconductor. The oxygen-excess region is formed in the crystalline oxide semiconductor layer 401, whereby oxygen vacancies can be filled immediately; thus, charge trapping centers in the crystalline oxide semiconductor layer 401 can be reduced. Note that the timing of the heat treatment is not limited to that described in this embodiment.

When oxygen implantation treatment is performed on the crystalline oxide semiconductor layer 401, a crystalline structure included in the oxide semiconductor layer 401 might be disordered to be an amorphous structure. However, the crystalline structure can be recovered by performing the heat treatment for filling oxygen vacancies.

Next, the insulating layer 416*a* is processed in a photolithography process to form the channel protective layer 416. Note that a resist mask used for forming the channel protective layer 416 may be formed by an inkjet method. Formation of the resist mask by an inkjet method needs no photomask; thus, the manufacturing cost of the semiconductor device can be reduced.

Next, the exposed regions of the crystalline oxide semiconductor layer 404 are irradiated with the nitrogen plasma 421 with the channel protective layer 416 used as a mask. By this nitrogen plasma treatment, parts of the crystalline oxide semiconductor layer 404 that are the exposed regions are nitrided, so that the crystalline oxide semiconductor layer 404 including the n-type source region 404*a*, the n-type drain region 404*b*, and the channel formation region 404*c* is formed (see FIG. 5C). Here, the channel formation region 404*c* interposed between the source region 404*a* and the drain region 404*b* is not exposed to the nitrogen plasma 421, and thus is an i-type or substantially i-type crystalline oxide semiconductor layer.

In the bottom-gate transistor 530, the source region 404*a* and the drain region 404*b* can be formed by irradiating the crystalline oxide semiconductor layer 401 with nitrogen plasma with the channel protective layer 416 used as a mask. The channel protective layer 416 has a function of protecting a back channel portion of the crystalline oxide semiconductor layer 404. Note that the channel protective layer 416 may be removed after the source region 404*a* and the drain region 404*b* are formed.

Next, a conductive film which is to be the source electrode 405*a* and the drain electrode 405*b* (including a wiring formed from the same layer as the electrodes) is formed over the crystalline oxide semiconductor layer 404 and the channel protective layer 416 and is processed, so that the source electrode 405*a* and the drain electrode 405*b* are formed. The source electrode 405*a* and the drain electrode 405*b* can be formed using a material and a method similar to those of the source electrode 415*a* and the drain electrode 415*b*.

Next, the insulating layer 414 which covers the source electrode 405*a*, the drain electrode 405*b*, and the channel protective layer 416 is formed. Through the above steps, the transistor 530 can be manufactured (see FIG. 5D).

The insulating layer 414 can be formed using a material and a method similar to those of the insulating layer 412.

The transistor 520 and the transistor 530 which are described in this embodiment includes the source region 404*a* or the drain region 404*b* in a region in the crystalline oxide semiconductor layer 404, which is in contact with the source electrode 405*a* or the drain electrode 405*b*. By this structure, the contact between the crystalline oxide semiconductor layer 404 and the source electrode 405*a* or the drain electrode 405*b* can be ohmic contact, and thermally stable operation as compared to the case of Schottky junction can be obtained. In addition, the contact resistance can be reduced. As a result, the on-state current of the transistor 520 and the transistor 530 can be increased.

In addition, it is important to provide the source region 404*a* and the drain region 404*b* in order to supply carriers to the channel (on the source side), to stably absorb carriers from the channel (on the drain side), or to prevent a resistance component from being formed at an interface with the source electrode (or the drain electrode). Further, providing an n$^+$ layer makes it possible to keep good mobility even at high drain voltage.

In the transistor 520 and the transistor 530 which are described in this embodiment, the source region 404*a*, the drain region 404*b*, and the channel formation region 404*c* are each a crystalline region, so that the bonding among the source region 404*a*, the channel formation region 404*c*, and the drain region 404*b* can be favorable. Further, the source region 404*a*, the drain region 404*b*, and the channel formation region 404*c* are each a crystalline region, so that the level in a band gap of the crystalline oxide semiconductor layer 404 can be reduced. Therefore, the transistor characteristics can be improved. In addition, the reliability of the transistor 520 and the transistor 530 can be improved.

The structures, methods, and the like described in this embodiment can be combined as appropriate with any of the structures, methods, and the like described in the other embodiments.

(Embodiment 3)

A semiconductor device with a display function (also referred to as a display device) can be manufactured with the use of the transistor described in Embodiment 1 or 2. Moreover, some or all of the driver circuits which include the transistor can be formed over a substrate where the pixel portion is formed, whereby a system-on-panel can be obtained.

Figure 6A:
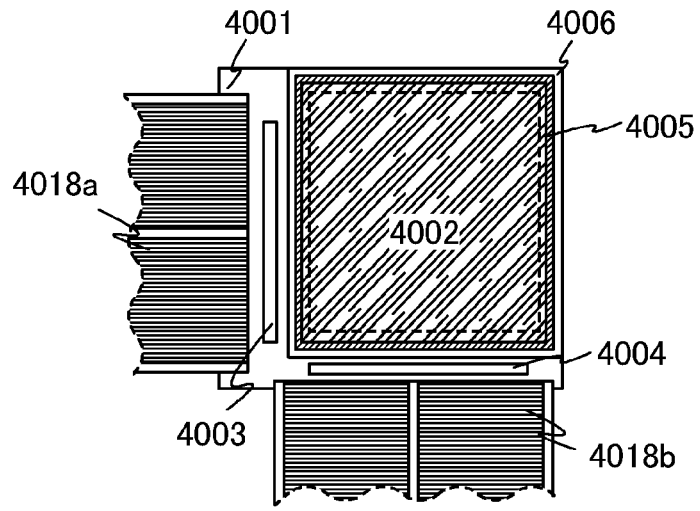
FIGS. 6A to 6C are cross-sectional views each illustrating one embodiment of a semiconductor device.

In FIG. 6A, a sealant 4005 is provided to surround a pixel portion 4002 provided over a first substrate 4001, and the pixel portion 4002 is sealed with the sealant 4005 and the second substrate 4006. In FIG. 6A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. A variety of signals and potentials which are provided to the pixel portion 4002 through the signal line driver circuit 4003 and the scan line driver circuit 4004 are supplied from flexible printed circuits (FPCs) 4018*a* and 4018*b*.

Figure 6B:
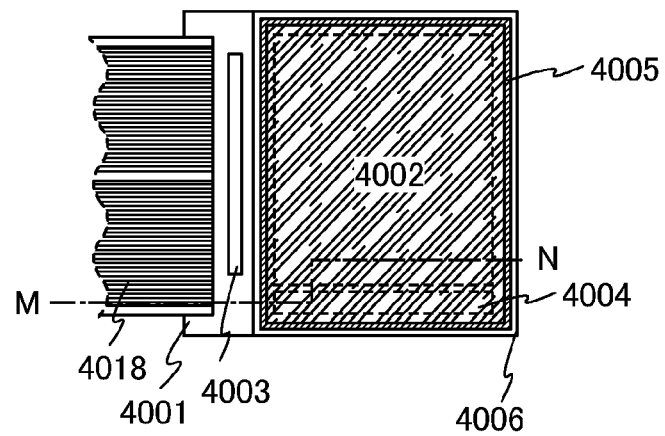
Figure 6C:
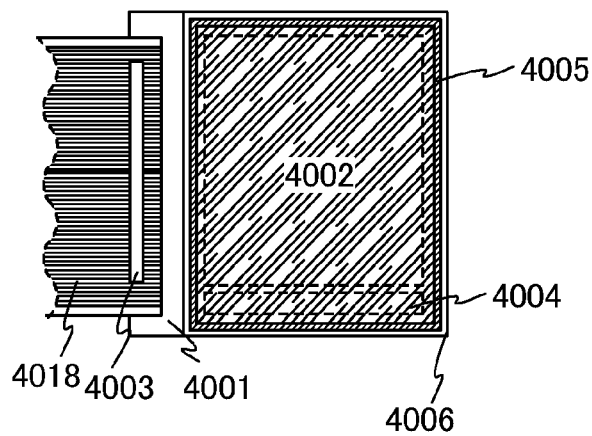

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 6B and 6C, the signal line driver circuit 4003 is formed using a single crystal semiconductor film or a polycrystalline semiconductor film over a substrate prepared separately, and mounted in a region different from the region surrounded by the sealant 4005 over the first substrate 4001. In FIGS. 6B and 6C, a variety of signals and potentials which are provided to the pixel portion 4002 through the signal line driver circuit 4003 and the scan line driver circuit 4004 are supplied from an FPC 4018.

Although FIGS. 6B and 6C each show the example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method or the like can be used. FIG. 6A illustrates an example in which the signal line driver circuit 4003 and the scan line driver circuit 4004 are mounted by a COG method. FIG. 6B illustrates an example in which the signal line driver circuit 4003 is mounted by a COG method. FIG. 6C illustrates an example in which the signal line driver circuit 4003 is mounted by a TAB method.

Note that the display device includes a panel in which the display element is sealed, and a module in which an IC including a controller or the like is mounted on the panel.

In other words, a display device in this specification means an image display device, a display device, or a light source (including a lighting device). Furthermore, the display device also includes not only a panel in which the display element is sealed but also the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors and the transistor described in Embodiment 1 or 2 can be used.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as an electronic ink display (electronic paper), can be used.

Embodiments of the semiconductor device will be described with reference to FIGS. 6A to 6C and FIGS. 7A and 7B. FIGS. 7A and 7B are cross-sectional views along M-N in FIG. 6B.

As illustrated in FIGS. 6A to 6C and FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030. The terminal electrode 4016 is formed using the same conductive film as source and drain electrode layers of transistors 4010 and 4011.

Each of the pixel portion 4002 and the scan line driver circuit 4004 which are provided over the first substrate 4001 includes a plurality of transistors. In FIGS. 6A to 6C and FIGS. 7A and 7B, the transistor 4010 included in the pixel portion 4002 and the transistor 4011 included in the scan line driver circuit 4004 are illustrated as an example. In FIG. 7A, an insulating layer 4020 is provided over the transistors 4010 and 4011, and in FIG. 7B, an insulating layer 4021 is provided over the insulating layer 4020. Note that an insulating layer 4023 is an insulating layer serving as a base film.

The transistor described in Embodiment 1 or 2 can be used as each of the transistor 4010 and the transistor 4011. In this embodiment, an example in which a transistor having a structure similar to that of the transistor 520 described in Embodiment 2 is used is described.

The transistor 4010 and the transistor 4011 are each a transistor including a crystalline oxide semiconductor layer in which low-resistance regions serving as a source region and a drain region (hereinafter, also simply referred to as low-resistance regions) are provided with a channel formation region positioned therebetween in the channel length direction. Thus, the transistor 4010 and the transistor 4011 have excellent on-state characteristics (e.g., high on-state current and high electric field mobility) and are capable of high-speed operation and high-speed response. In addition, miniaturization can be achieved.

Consequently, semiconductor devices with high performance and high reliability can be provided as the semiconductor devices of this embodiment illustrated in FIGS. 6A to 6C and FIGS. 7A and 7B.

The transistor 4010 included in the pixel portion 4002 is electrically connected to a display element to form a display panel. There is no particular limitation on the kind of the display element as long as display can be performed, and a variety of kinds of display elements can be employed.

FIG. 7A illustrates an example of a liquid crystal display device using a liquid crystal element as a display element. In FIG. 7A, a liquid crystal element 4013 includes the first electrode layer 4030, a second electrode layer 4031, and a liquid crystal layer 4008. An insulating layer 4032 and an insulating layer 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer denoted by reference numeral 4035 is obtained by selective etching of an insulating layer and is provided in order to control the thickness (cell gap) of the liquid crystal layer 4008. Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystals may be a low molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the productivity of the liquid crystal display device can be increased.

The specific resistivity of the liquid crystal material is higher than or equal to $1\times10^9$ $\Omega\cdot$cm, preferably higher than or equal to $1\times10^{11}$ $\Omega\cdot$cm, further preferably higher than or equal to $1\times10^{12}$ $\Omega\cdot$cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including the crystalline oxide semiconductor layer which is disclosed in this specification, it is enough to provide a storage capacitor having a capacitance that is ⅓ or less, preferably ⅕ or less of liquid crystal capacitance of each pixel.

In the transistor including the crystalline oxide semiconductor layer which is disclosed in this specification, the current in an off state (off-state current) can be made small. Accordingly, an electric signal such as image data can be retained for a longer period and a writing interval can be set longer. Accordingly, the frequency of refresh operation can be reduced, which leads to an effect of suppressing power consumption.

The transistor including the crystalline oxide semiconductor layer which is disclosed in this specification can have high field-effect mobility, and thus can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided. Thus, the reliability of the semiconductor device can be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, so that the light-emitting organic compound is excited. The light-emitting organic compound returns to a ground state from the excited state, thereby emitting light. Owing to such a mechanism, this light-emitting element is referred to as current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that description is made here using an organic EL element as a light-emitting element.

In order to extract light emitted from the light-emitting element, at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. A light-emitting element having any of these emission structures can be used.

FIG. 7B illustrates an example of a light-emitting device in which a light-emitting element is used as a display element. A light-emitting element 4513 is electrically connected to the transistor 4010 provided in the pixel portion 4002. The structure of the light-emitting element 4513 is not limited to the stacked structure including the first electrode layer 4030, an electroluminescent layer 4511, and the second electrode layer 4031, which is illustrated in FIG. 7B. The structure of the light-emitting element 4513 can be changed as appropriate depending on the direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, poly(vinyl chloride) (PVC), an acrylic resin, a polyimide, an epoxy resin, a silicone resin, poly(vinyl butyral) (PVB), or a copolymer of ethylene with vinyl acetate (EVA) can be used.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have a variety of modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A dispersion of the above microcapsules in a solvent is referred to as electronic ink. By using a color filter or particles that have a pigment, color display can also be achieved.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 6A to 6C and FIGS. 7A and 7B, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating layer 4020.

The aluminum oxide film provided as the insulating layer 4020 over the crystalline oxide semiconductor layer has a high shielding effect (blocking effect) and thus is less likely to transmit both oxygen and impurities such as hydrogen and moisture.

Thus, the aluminum oxide film serves as a protective film which prevents entry of impurities such as hydrogen and moisture, which cause variation, into the crystalline oxide semiconductor layer and release of oxygen from the crystalline oxide semiconductor layer during and after the manufacturing process.

The insulating layer 4021 functioning as a planarizing insulating layer can be formed using an organic material having heat resistance, such as an acrylic resin, a polyimide, a benzocyclobutene-based resin, a polyamide, or an epoxy. Other than such organic materials, it is also possible to use a low-dielectric constant material (low-k material) such as a siloxane-based resin, phosphosilicate glass (PSG), or borophosphosilicate glass (BPSG). Note that the insulating layer 4021 may be formed by stacking a plurality of insulating layers formed using any of these materials.

There is no particular limitation on the method of forming the insulating layer 4021, and the following method or tool (equipment) can be used depending on the material: a sputtering method, an SOG method, spin coating, dipping, spray coating, a droplet discharge method (such as an inkjet method), screen printing, offset printing, a doctor knife, a roll coater, a curtain coater, a knife coater, or the like.

The display device displays an image by transmitting light from a light source or a display element. Therefore, the substrate and the thin films such as the insulating layer and the conductive film provided for the pixel portion where light is transmitted have light-transmitting properties with respect to light in the visible light wavelength range.

The first electrode layer and the second electrode layer (which is also referred to as pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A protective circuit for protecting the driver circuit may be provided. The protective circuit is preferably formed using a nonlinear element.

As described above, by using the transistor described in Embodiment 1 or 2, the semiconductor device can have a variety of functions.

(Embodiment 4)

A semiconductor device having an image sensor function of reading information on an object can be manufactured with the use of the transistor described in Embodiment 1 or 2.

Figure 8A:
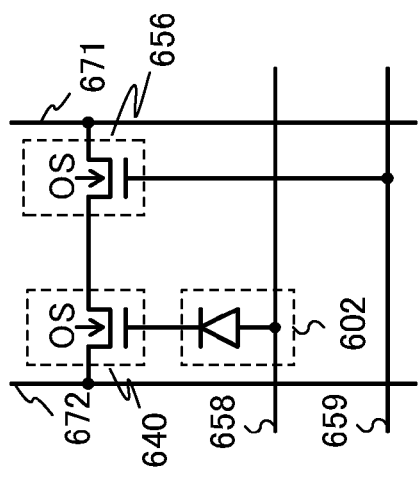
FIGS. 8A and 8B are views illustrating one embodiment of a semiconductor device.

FIG. 8A illustrates an example of a semiconductor device having an image sensor function. FIG. 8A is an equivalent circuit of a photo sensor and FIG. 8B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including a crystalline oxide semiconductor layer is denoted by a symbol "OS" so that it can be identified as a transistor including a crystalline oxide semiconductor layer. In FIG. 8A, the transistor 640 and the transistor 656 are each a transistor including a crystalline oxide semiconductor layer, to which the transistor described in Embodiment 1 or 2 can be applied. Described in this embodiment is an example in which a transistor having a structure similar to that of the transistor 520 described in Embodiment 2 is used.

Figure 8B:
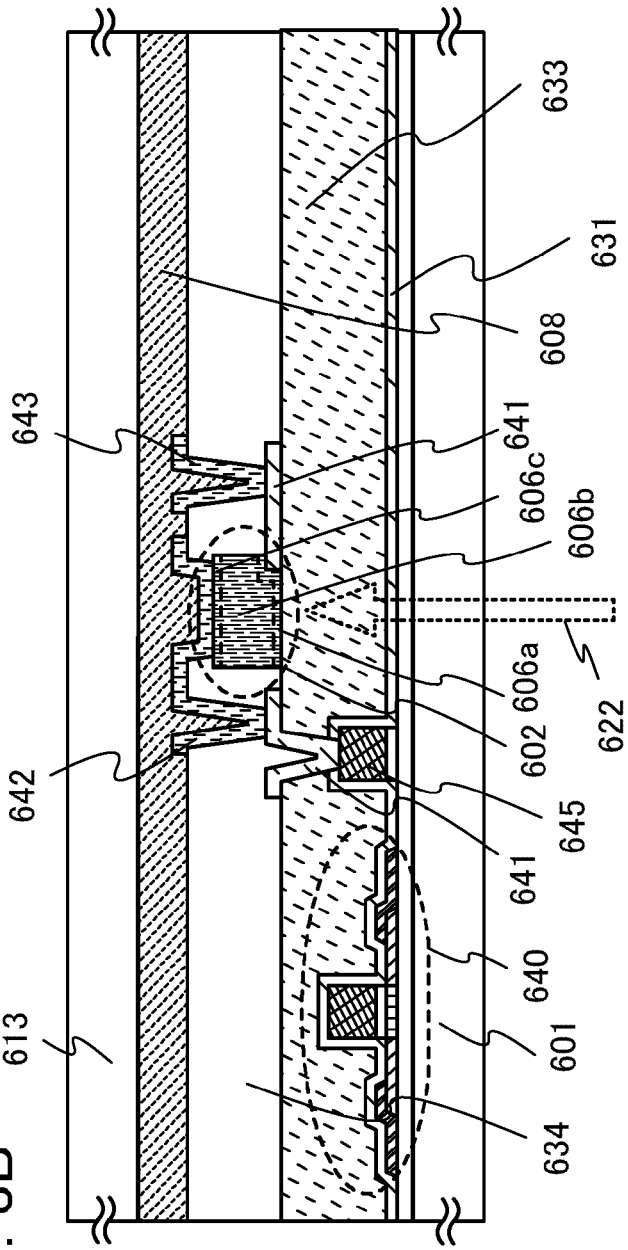

FIG. 8B is a cross-sectional view of the photodiode 602 and the transistor 640 in the photo sensor. The photodiode 602 serving as a sensor and the transistor 640 are provided over a substrate 601 (TFT substrate) with an insulating surface. A substrate 613 is provided over the photodiode 602 and the transistor 640 with an adhesive layer 608 positioned therebetween.

An insulating layer 631, an insulating layer 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is thermodynamically stable and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a radio-frequency plasma CVD method with a frequency of greater than or equal to several tens of megahertz and less than or equal to several hundreds of megahertz, or a microwave plasma CVD apparatus with a frequency of greater than or equal to 1 GHz. Typically, the microcrystalline semiconductor can be formed using silicon hydride such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed by dilution of silicon hydride with one or plural kinds of rare gas elements selected from helium, argon, krypton, and neon in addition to hydrogen. In those cases, the flow ratio of hydrogen to the compound containing silicon (e.g., silicon hydride) is 5:1 to 200:1, preferably 50:1 to 150:1, further preferably 100:1. Further, a hydrocarbon gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane.

Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating layer 632, the interlayer insulating film 633, and the interlayer insulating film 634 can be formed, depending on the material, using a method or a tool (equipment) such as a sputtering method, a plasma CVD method, an SOG method, spin coating, dipping, spray coating, a droplet discharge method (e.g., an inkjet method), a printing method (e.g., screen printing or offset printing), a doctor knife, a roll coater, a curtain coater, or a knife coater.

In this embodiment, an aluminum oxide film is used as the insulating layer 631. The insulating layer 631 can be formed by a sputtering method, a plasma CVD method, or the like.

The aluminum oxide film provided as the insulating layer 631 over the crystalline oxide semiconductor layer has a high shielding effect (blocking effect) of preventing penetration of both oxygen and impurities such as hydrogen and moisture.

Therefore, in and after the manufacturing process, the aluminum oxide film serves as a protective film for preventing entry of impurities such as hydrogen or moisture, which cause variation, into the crystalline oxide semiconductor layer and release of oxygen, which is a main component material of the oxide semiconductor, from the crystalline oxide semiconductor layer.

The insulating layer 632 can be formed using an inorganic insulating material and can have a single-layer structure or a stacked structure which includes any of oxide insulating layers such as a silicon oxide layer, a silicon oxynitride layer, an aluminum oxide layer, and an aluminum oxynitride layer; and nitride insulating layers such as a silicon nitride layer, a silicon nitride oxide layer, an aluminum nitride layer, and an aluminum nitride oxide layer.

For a reduction in surface roughness, an insulating layer functioning as a planarizing insulating layer is preferably used as each of the interlayer insulating films 633 and 634. For the interlayer insulating films 633 and 634, for example, an organic insulating material having heat resistance such as polyimide, an acrylic resin, a benzocyclobutene resin, polyamide, or an epoxy resin can be used. Other than the above organic insulating materials, it is possible to use a single layer or stacked layers of any of low-dielectric constant materials (low-k material) such as a siloxane-based resin, phosphosilicate glass (PSG), and borophosphosilicate glass (BPSG).

When the light that enters the photodiode 602 is detected, information on an object to be detected can be read. Note that a light source such as a backlight can be used at the time of reading information on an object.

Like the transistors described in Embodiment 1 and 2, a transistor which includes a crystalline oxide semiconductor layer in which low-resistance regions are provided with a channel formation region positioned therebetween in the channel length direction has excellent on-state characteristics (e.g., high on-state current and high electric-field mobility) and is capable of high-speed operation and high-speed response. In addition, miniaturization can be achieved. Thus, the use of the transistor makes it possible to provide a semiconductor device with high performance and high reliability.

This embodiment can be implemented in appropriate combination with any of the structures described in the other embodiments.

(Embodiment 5)

The transistor described in Embodiment 1 or 2 can be preferably used in a semiconductor device including an integrated circuit in which a plurality of transistors are stacked. In this embodiment, as an example of the semiconductor device, a memory medium (memory element) will be described.

In this embodiment, a semiconductor device is manufactured which includes a transistor 140 which is a first transistor formed using a single crystal semiconductor substrate and a transistor 162 which is a second transistor formed using a semiconductor film and provided above the transistor 140 with an insulating layer positioned between the transistor 140 and the transistor 162. The transistor described in Embodiment 1 or 2 can be preferably used as the transistor 162. In this embodiment, an example in which a transistor having a structure similar to that of the transistor 520 described in Embodiment 2 is used as the transistor 162 will be described.

Semiconductor materials and structures of the transistor 140 and the transistor 162, which are stacked, may be the same or different from each other. Described in this embodiment is an example in which materials and structures which are suitable for a circuit of the memory medium (memory element) are employed for the transistors.

Figure 9A:
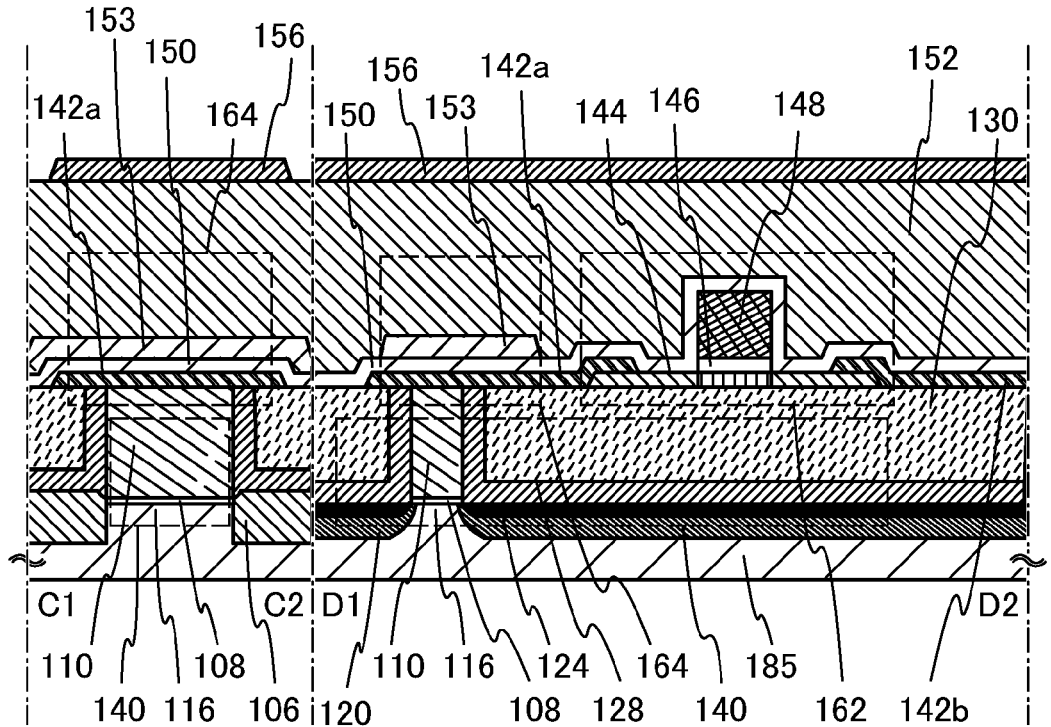
FIGS. 9A to 9C are views illustrating one embodiment of a semiconductor device.
Figure 9B:
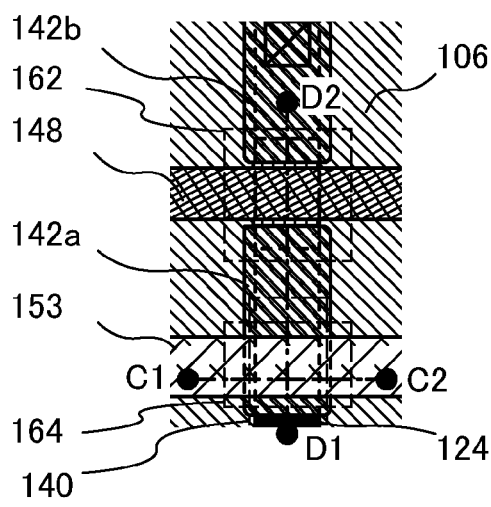
Figure 9C:
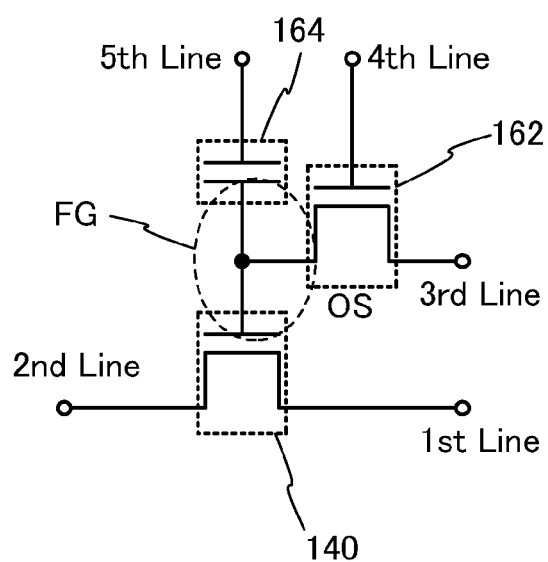

FIGS. 9A and 9B illustrate an example of the structure of the semiconductor device. FIG. 9A is a cross-sectional view of the semiconductor device and FIG. 9B is a plan view of the semiconductor device. FIG. 9A corresponds to a cross-sectional view along C1-C2 and D1-D2 in FIG. 9B. In addition, FIG. 9C illustrates an example of a diagram of a circuit including the semiconductor device as a memory element. The semiconductor device illustrated in FIGS. 9A and 9B includes the transistor 140 formed using a first semiconductor material in a lower portion, and the transistor 162 formed using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material other than an oxide semiconductor can easily operate at high speed. On the other hand, a transistor including an oxide semiconductor enables charge to be held for a long time owing to its characteristics.

A method of manufacturing the semiconductor device in FIGS. 9A to 9C will be described with reference to FIGS. 9A to 9C.

The transistor 140 includes a channel formation region 116 provided in a substrate 185 containing a semiconductor material (e.g., silicon), impurity regions 120 provided so that the channel formation region 116 is provided therebetween, metal compound regions 124 in contact with the impurity regions 120, a gate insulating layer 108 provided over the channel formation region 116, and a gate electrode 110 provided over the gate insulating layer 108.

As the substrate 185 including a semiconductor material, a single crystal semiconductor substrate or a polycrystalline semiconductor substrate made of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film including a material other than silicon is provided over an insulating surface. In other words, a semiconductor film included in the "SOI substrate" is not limited to a silicon semiconductor film. Moreover, the SOI substrate can be a substrate having a structure where a semiconductor film is provided over an insulating substrate such as a glass substrate with an insulating layer positioned therebetween.

As a method of forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing a phenomenon in which microvoids formed by hydrogen ion irradiation grow because of heat treatment; a method in which a single crystal semiconductor film is formed over an insulating surface by crystal growth; and the like.

For example, ions are added through one surface of a single crystal semiconductor substrate, an embrittlement layer is formed at a certain depth from the surface of the single crystal semiconductor substrate, and an insulating layer is formed over either the surface of the single crystal semiconductor substrate or an element substrate. Heat treatment is performed in a state where the single crystal semiconductor substrate and the element substrate are bonded to each other with the insulating layer positioned therebetween, so that a crack is generated in the embrittlement layer and the single crystal semiconductor substrate is separated along the embrittlement layer. Accordingly, a single crystal semiconductor film, which is separated from the single crystal semiconductor substrate, is formed as a semiconductor film over the element substrate. An SOI substrate formed by the above method can also be preferably used.

An element isolation insulating layer 106 is provided over the substrate 185 so as to surround the transistor 140. Note that for high integration, it is preferable that, as in FIGS. 9A to 9C, the transistor 140 do not include a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 including a single crystal semiconductor substrate can operate at high speed. Thus, when the transistor is used as a reading transistor, data can be read at high speed. Two insulating layers are formed so as to cover the transistor 140. As treatment prior to formation of the transistor 162 and a capacitor 164, CMP treatment is performed on the two insulating layers, whereby an insulating layer 128 and an insulating layer 130 which are planarized are formed and, at the same time, an upper surface of the gate electrode 110 is exposed.

As each of the insulating layer 128 and the insulating layer 130, typically, it is possible to use an inorganic insulating layer such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than the above organic materials, it is also possible to use a low-dielectric constant material (a low-k material) or the like. In the case of using an organic material, a wet process such as a spin coating method or a printing method may be used to form the insulating layer 128 and the insulating layer 130.

Note that in the insulating layer 130, a silicon oxide film is used as a film to be in contact with the semiconductor film.

In this embodiment, a 50-nm-thick silicon oxynitride film is formed by a sputtering method for the insulating layer 128, and a 550-nm-thick silicon oxide film is formed by a sputtering method for the insulating layer 130.

A semiconductor film is formed over the insulating layer 130 which has been sufficiently planarized by CMP treatment. In this embodiment, as the semiconductor film, a crystalline oxide semiconductor layer is formed by a sputtering method with the use of an In—Ga—Zn-based oxide target.

Next, the crystalline oxide semiconductor layer is selectively etched to form an island-shaped crystalline oxide semiconductor layer 144. A source or drain electrode 142a and a source or drain electrode 142b are formed over the crystalline oxide semiconductor layer 144.

A gate insulating layer 146 and a gate electrode 148 are formed over the crystalline oxide semiconductor layer 144. The gate electrode 148 can be formed by forming a conductive layer and then selectively etching the conductive layer. The gate insulating layer 146 is formed by etching an insulating layer with the gate electrode 148 used as a mask.

As the gate insulating layer 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma enhanced CVD method, a sputtering method, or the like.

The conductive layer which can be used for each of the gate electrode 110, the source or drain electrode 142a, and the source or drain electrode 142b can be formed by a PVD method such as a sputtering method or a CVD method such as a plasma CVD method. Further, as the material for the conductive layer, an element selected from Al, Cr, Cu, Ta, Ti, Mo, and W, an alloy including the above element as its component, or the like can be used. Any of Mn, Mg, Zr, Be, Nd, and Sc, or a material containing any of these in combination may be used.

The conductive layer may have a single-layer structure or a stacked structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

After the gate electrode 148 is formed, the gate insulating layer is etched with the gate electrode 148 used as a mask, and parts of the crystalline oxide semiconductor layer 144, which are exposed by the etching treatment, are subjected to nitrogen plasma treatment. Through the above steps, the transistor 162 which includes the crystalline oxide semiconductor layer 144 including crystalline low-resistance regions containing nitrogen between which a channel formation region is interposed can be manufactured.

The transistor 162 includes the crystalline oxide semiconductor layer 144 including the low-resistance regions between which the channel formation region is interposed in the channel length direction, whereby the transistor 162 has excellent on-state characteristics (e.g., high on-state current and high electric-field mobility) and is capable of high-speed operation and high-speed response.

The low-resistance regions can serve as a source region and a drain region. By providing the low-resistance regions, an electric field applied to the channel formation region formed between the low-resistance regions can be suppressed. In the low-resistance regions, the crystalline oxide semiconductor layer 144 is electrically connected to the source or drain electrode 142a and the source or drain electrode 142b, whereby the contact resistance between the crystalline oxide semiconductor layer 144 and the source or drain electrode 142a and between the crystalline oxide semiconductor layer 144 and the source or drain electrode 142b can be reduced.

An insulating layer 150 is provided over the crystalline oxide semiconductor layer 144. The insulating layer 150 may have a stacked structure. The insulating layer 150 can be formed using any of a silicon oxide film, a silicon nitride film, a silicon oxynitride film, a silicon nitride oxide film, an aluminum nitride film, an aluminum oxide film, an aluminum oxynitride film, an aluminum nitride oxide film, a hafnium oxide film, and a gallium oxide film by a plasma CVD method, a sputtering method, or the like.

In this embodiment, an aluminum oxide film is used as the insulating layer 150. The aluminum oxide film has a high shielding effect (blocking effect) of preventing penetration of both oxygen and impurities such as hydrogen or moisture. Therefore, in and after the manufacturing process, the aluminum oxide film functions as a protective film for preventing entry of impurities such as hydrogen and moisture, which cause variation, into the crystalline oxide semiconductor layer 144 and release of oxygen, which is a main component material of the oxide semiconductor, from the crystalline oxide semiconductor layer 144.

Over the insulating layer 150, an electrode layer 153 is formed in a region which overlaps with the source or drain electrode 142a.

Next, an insulating layer 152 is formed over the transistor 162 and the insulating layer 150. The insulating layer 152 can be formed by a sputtering method, a CVD method, or the like. The insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the gate insulating layer 146, the insulating layer 150, and the insulating layer 152. The opening is formed by selective etching with the use of a mask or the like.

After that, a wiring 156 is formed in the opening to be in contact with the source or drain electrode 142b. Note that FIGS. 9A to 9C do not illustrate a portion where the source or drain electrode 142b and the wiring 156 are connected to each other.

The wiring 156 is formed in such a manner that a conductive layer is formed by a PVD method such as a sputtering method or a CVD method such as a plasma CVD method and then the conductive layer is etched. Further, as the material for the conductive layer, an element selected from Al, Cr, Cu, Ta, Ti, Mo, and W, an alloy containing the above element as its component, or the like can be used. Any of Mn, Mg, Zr, Be, Nd, and Sc, or a material containing any of these in combination may be used. The details are similar to those of the source or drain electrode 142a or the like.

Through the above steps, the transistor 162 and the capacitor 164 are completed. The transistor 162 includes the highly purified crystalline oxide semiconductor layer 144 containing excess oxygen with which an oxygen vacancy is filled. Therefore, the transistor 162 has less variation in the electrical characteristics and is electrically stable. The capacitor 164 includes the source or drain electrode 142a, the crystalline oxide semiconductor layer 144, the gate insulating layer 146, and the electrode layer 153.

The crystalline oxide semiconductor layer 144 and the gate insulating layer 146 are stacked in the capacitor 164 in FIG. 9A, whereby the insulation between the source or drain electrode 142a and the electrode layer 153 can be adequately ensured. Needless to say, the capacitor 164 without the crystalline oxide semiconductor layer 144 may be employed in order to secure sufficient capacitance. Alternatively, an insulating layer may be included in the capacitor 164. Further alternatively, the capacitor 164 may be omitted in the case where a capacitor is not needed.

FIG. 9C illustrates an example of a diagram of a circuit including the semiconductor device as a memory element. In FIG. 9C, one of a source electrode and drain electrode of the transistor 162, one electrode of the capacitor 164, and a gate electrode of the transistor 140 are electrically connected to one another. A first wiring (1st line, also referred to as source line) is electrically connected to a source electrode of the transistor 140. A second wiring (2nd line, also referred to as bit line) is electrically connected to a drain electrode of the transistor 140. A third wiring (3rd line, also referred to as first signal line) is electrically connected to the other of the source electrode and the drain electrode of the transistor 162. A fourth wiring (4th line, also referred to as second signal line) is electrically connected to a gate electrode of the transistor 162. A fifth wiring (5th line, also referred to as word line) is electrically connected to the other electrode of the capacitor 164.

The transistor 162 formed using an oxide semiconductor has extremely small off-state current; therefore, when the transistor 162 is in an off state, a potential of a node (hereinafter node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge applied to the node FG and reading of stored data.

When data is stored in the semiconductor device (writing), the potential of the fourth wiring is set to a potential at which the transistor 162 is turned on, whereby the transistor 162 is turned on. Thus, the potential of the third wiring is supplied to the node FG, and the predetermined amount of charge is accumulated in the node FG. Here, charge for applying either of two different potential levels (hereinafter referred to as low-level charge and high-level charge) is applied. After that, the potential of the fourth wiring is set to a potential at which the transistor 162 is turned off, whereby the transistor 162 is turned off. Thus, the predetermined charge is held in the node FG. The predetermined amount of charge is thus accumulated and held in the node FG, whereby the memory cell can store data.

Since the off-state current of the transistor 162 is extremely small, the charge applied to the node FG is held for a long time. Thus, refresh operation becomes unnecessary or the frequency of the refresh operation can be extremely lowered, which leads to a sufficient reduction in power consumption. Moreover, stored data can be retained for a long period even when power is not supplied.

When stored data is read out (reading), while a predetermined potential (fixed potential) is supplied to the first wiring, an appropriate potential (reading potential) is supplied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is lower than an apparent threshold value $V_{th\_L}$ of the transistor 140 in the case where the low-level charge is held in the node FG. Here, an apparent threshold value refers to a potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level charge is applied in writing, when the potential of the fifth wiring is set to $V_0$ ($>V_{th\_H}$), the transistor 140 is turned on. In the case where the low-level charge is applied in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is supplied to the node FG that is holding the predetermined amount of charge applied in the above writing, so that the charge for new data is held in the node FG. Specifically, the potential of the fourth wiring is set to a potential at which the transistor 162 is turned on, whereby the transistor 162 is turned on. Thus, the potential of the third wiring (potential for new data) is supplied to the node FG, and the predetermined amount of charge is accumulated in the node FG. After that, the potential of the fourth wiring is set to a potential at which the transistor 162 is turned off, whereby the transistor 162 is turned off. Thus, charge for the new data is held in the node FG. In other words, while the predetermined amount of charge applied in the first writing is held in the node FG, the same operation (second writing) as in the first writing is performed, whereby the stored data can be overwritten.

The purified crystalline oxide semiconductor layer containing excess oxygen, which is disclosed in this specification, is included in the transistor 162 described in this embodiment, whereby the off-state current of the transistor 162 can be sufficiently reduced. Further, by the use of such a transistor makes it possible to obtain a semiconductor device in which stored data can be retained for an extremely long time.

As described above, a transistor which includes a crystalline oxide semiconductor layer in which low-resistance regions are provided with a channel formation region interposed therebetween in the channel length direction has low off-state current and excellent on-state characteristics (e.g., high on-state current and high electric-field mobility) and is capable of high-speed operation and high-speed response. In addition, miniaturization can be achieved. Thus, the use of the transistor makes it possible to provide a semiconductor device with high performance and high reliability.

The structures, methods, and the like described in this embodiment can be combined as appropriate with any of the methods, structures, and the like described in the other embodiments.

(Embodiment 6)

A semiconductor device disclosed in this specification can be applied to a variety of electronic devices (including game machines). Examples of the electronic device are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of the electronic device including the semiconductor device described in the above embodiment will be described.

Figure 10A:
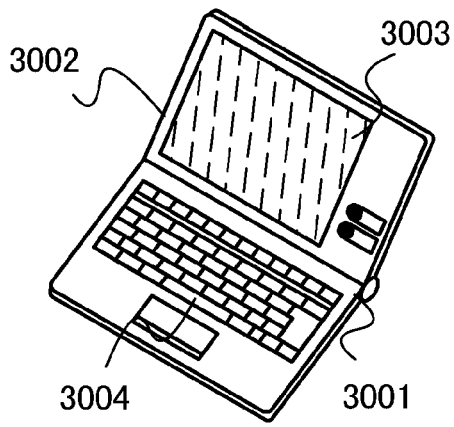
FIGS. 10A to 10F are views each illustrating one embodiment of a semiconductor device.

FIG. 10A illustrates a laptop personal computer, which includes a main body 3001, a housing 3002, a display portion 3003, a keyboard 3004, and the like. The semiconductor device described in any of the above embodiments is applied to the display portion 3003, whereby a laptop personal computer with high performance and high reliability can be provided.

Figure 10B:
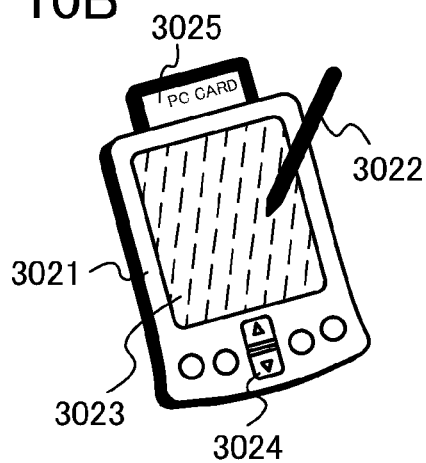

FIG. 10B is a portable information terminal (PDA) which includes a display portion 3023, an external interface 3025, an operation button 3024, and the like in a main body 3021. A stylus 3022 is included as an accessory for operation. The semiconductor device described in any of the above embodiments is applied to the display portion 3023, whereby a personal digital assistant (PDA) with high performance and high reliability can be provided.

Figure 10C:
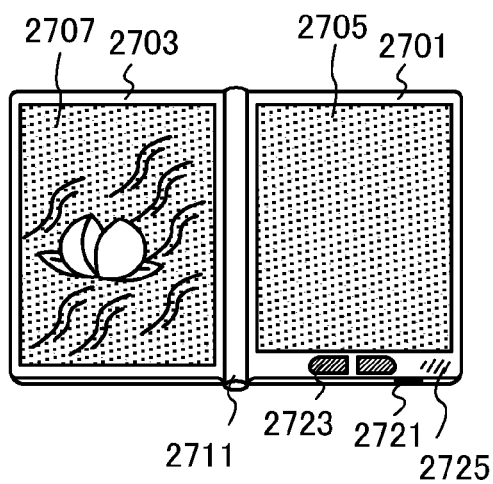

FIG. 10C illustrates an example of an e-book reader. For example, an e-book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10C) and graphics can be displayed on a display portion on the left side (the display portion 2707 in FIG. 10C). The semiconductor device described in any of the above embodiments is applied to the display portion 2705 and the display portion 2707, whereby an e-book reader with high performance and high reliability can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 10C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an electronic book server.

Figure 10D:
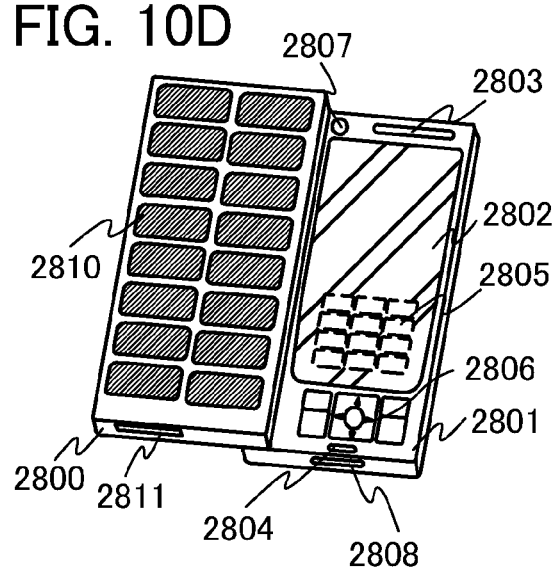

FIG. 10D illustrates a mobile phone, which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 includes a solar cell 2810 for charging the mobile phone, an external memory slot 2811, and the like. Further, an antenna is incorporated in the housing 2801. The semiconductor device described in any of the above embodiments is applied to the display panel 2802, whereby a mobile phone with high performance and high reliability can be provided.

Further, the display panel 2802 includes a touch panel. A plurality of operation keys 2805 which are displayed as images are indicated by dashed lines in FIG. 10D. Note that a boosting circuit by which a voltage output from the solar cell 2810 is increased so as to be sufficient for each circuit is also included.

The display panel 2802 changes the orientation of display as appropriate in accordance with the application mode. Further, the camera lens 2807 is provided on the same side as the display panel 2802, so that the mobile phone can be used as a video phone. The speaker 2803 and the microphone 2804 can be used for videophone calls, recording, and playing sound, and the like as well as voice calls. Moreover, the housing 2800 and the housing 2801 in a state where they are developed as illustrated in FIG. 10D can be slid so that one is lapped over the other. Therefore, the size of the mobile phone can be reduced, which makes the mobile phone suitable for being carried around.

The external connection terminal 2808 can be connected to an AC adaptor and a variety of cables such as a USB cable, and charging and data communication with a personal computer or the like are possible. Moreover, the mobile phone can store and transfer a larger amount of data by inserting a recording medium into the external memory slot 2811.

Further, in addition to the above functions, an infrared communication function, a television reception function, or the like may be provided.

Figure 10E:
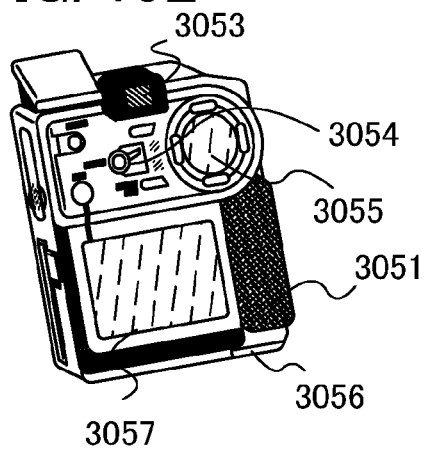

FIG. 10E illustrates a digital video camera, which includes a main body 3051, a display portion (A) 3057, an eyepiece 3053, an operation switch 3054, a display portion (B) 3055, a battery 3056, and the like. The semiconductor device described in any of the above embodiments is applied to the display portion (A) 3057 and the display portion (B) 3055, whereby a digital video camera with high performance and high reliability can be obtained.

Figure 10F:
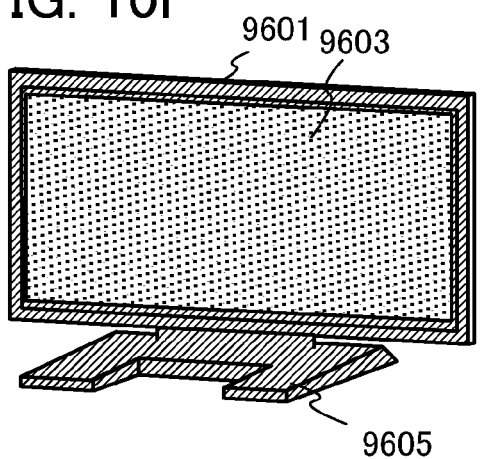

FIG. 10F illustrates an example of a television set. In the television set 9600, a display portion 9603 is incorporated in a housing 9601. The display portion 9603 can display images. Here, the housing 9601 is supported by a stand 9605. The semiconductor device described in any of the above embodiments is applied to the display portion 9603, whereby the television set 9600 can have high performance and high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, the television set can receive general television broadcasting. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

EXAMPLE 1

In this example, measurement results of sheet resistance of crystalline oxide semiconductor layers on which nitrogen plasma treatment is performed and evaluation results of the crystallinity of the crystalline oxide semiconductor layers will be described using comparison examples.

Methods of manufacturing Example Sample 1, Comparison Sample 1, Example Sample 2, and Comparison Sample 2 will be described below.

A silicon oxide film was formed to a thickness of 300 nm over a glass substrate by a sputtering method; the silicon oxide film was planarized by a reverse sputtering method; an In—Ga—Zn—O film was formed to a thickness of 20 nm over the planarized silicon oxide film; and heat treatment was performed, so that Comparison Sample 1 was manufactured. After the heat treatment, nitrogen plasma treatment was performed, so that Example Sample 1 was manufactured. The silicon oxide film was planarized by a CMP method instead of the reverse sputtering method in the manufacturing process of Comparison Sample 1, so that Comparison sample 2 was manufactured. Nitrogen plasma treatment was performed on Comparison Sample 2, so that Example Sample 2 was manufactured.

For each of Example Sample 1, Example Sample 2, Comparison Sample 1, and Comparison Sample 2, the silicon oxide film was formed under the following conditions: the target was a silicon oxide ($SiO_2$) target, the distance between the glass substrate and the target was 60 mm, the pressure was 0.4 Pa, the power of an RF power source was 1.5 kW, the atmosphere was a mixed atmosphere of argon and oxygen (the argon flow rate was 25 sccm and the oxygen flow rate was 25 sccm), and the substrate temperature was 100° C.

For each of Example Sample 1, Example Sample 2, Comparison Sample 1, and Comparison Sample 2, the In—Ga—Zn—O film was formed under the following conditions: the target was an oxide target having a composition ratio of $In_2O_3:Ga_2O_3:ZnO=1:1:2$ [molar ratio], the distance between the glass substrate and the target was 60 mm, the pressure was 0.4 Pa, the power of an RF power source was 0.5 kW, the atmosphere was a mixed atmosphere of argon and oxygen (the argon flow rate was 30 sccm and the oxygen flow rate was 15 sccm), and the substrate temperature was 300° C.

Further, for each of Example Sample 1, Example Sample 2, Comparison Sample 1, and Comparison Sample 2, after the formation of the In—Ga—Zn—O film, the heat treatment was performed at 450° C. in a nitrogen atmosphere for 1 hour to perform dehydration or dehydrogenation, and then a high-purity oxygen gas was introduced into the same furnace, whereby oxygen which is a main component material of an oxide semiconductor and is reduced due to a step of removing impurities for dehydration or dehydrogenation was supplied.

The planarization treatment for each of Example Sample 1 and Comparison Sample 1 was performed by the reverse sputtering method for 10 minutes under the following conditions: the flow rate of argon was 50 sccm, the pressure was 0.6 Pa, and the output was 200 W. Note that for each of Example Sample 1 and Comparison Sample 1, the formation of the silicon oxide film, the reverse sputtering, and the formation of the In—Ga—Zn—O film were performed in succession without exposure to the air.

As the planarization treatment for each of Example Sample 2 and Comparison Sample 2, the CMP treatment was performed under the following conditions: the slurry temperature was room temperature, the glass substrate and a polishing cloth were rotated at 60 rpm and 56 rpm, respectively, and the polishing pressure was 0.001 MPa. By this CMP treatment, the silicon oxide film was polished by 30 nm to be planarized.

For each of Example Sample 1 and Example Sample 2, the nitrogen treatment was performed using high-density plasma on the In—Ga—Zn—O film after being subjected to the heat treatment. The high-density plasma treatment was performed for 300 seconds under the following conditions: the atmosphere was a mixed atmosphere of argon and nitrogen (the flow rate of argon was 1000 sccm and the flow rate of nitrogen was 500 sccm), the substrate temperature was 450° C., the reaction pressure was 6 Pa, the microwave power output was 3000 W, and the microwave frequency was 2.45 GHz.

Figure 11:
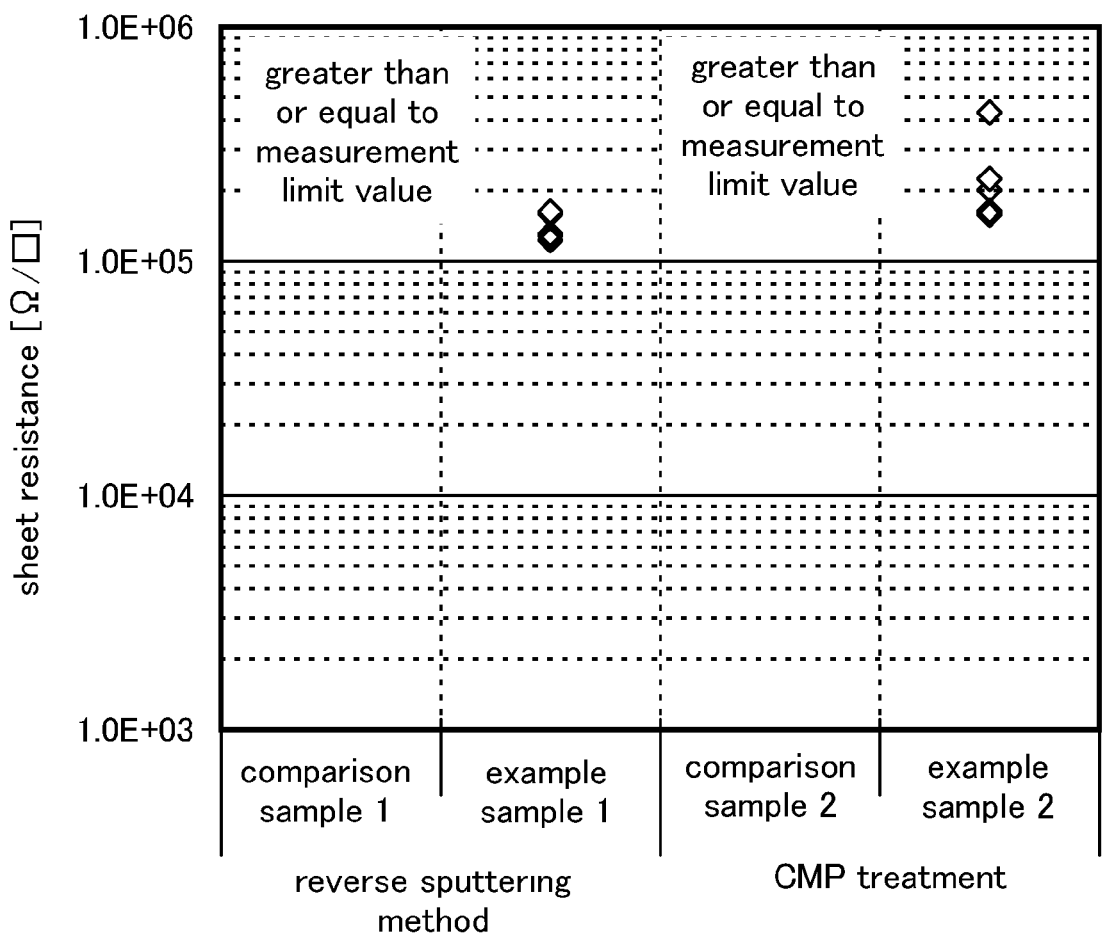
FIG. 11 shows measurement results of sheet resistance of samples manufactured in Example.

The sheet resistance of each of Example Sample 1, Comparison Sample 1, Example Sample 2, and Comparison Sample 2 manufactured through the above steps was measured. FIG. 11 shows the results of the measurement performed on five portions in a plane of each sample. Note that the resistivity processor (product name: Σ-10) manufactured by NPS, INC. was used for the measurement.

As shown in FIG. 11, the sheet resistance of each of Comparison Sample 1 and Comparison Sample 2, which were not subjected to the nitrogen plasma treatment, is greater than or equal to the measurement limit value ($5.0 \times 10^6$ Ω/square) of the resistivity processor. In contrast, the average value of the sheet resistance of Example Sample 1, which was subjected to the nitrogen plasma treatment, is about $1.4 \times 10^5$ Ω/square, and the average value of the sheet resistance of Example Sample 2, which was subjected to the nitrogen plasma treatment, is about $2.4 \times 10^5$ Ω/square.

The above results show that by the nitrogen plasma treatment, the sheet resistance of the oxide semiconductor layer is reduced, that is, the conductivity of the oxide semiconductor layer is increased.

Figure 12A:
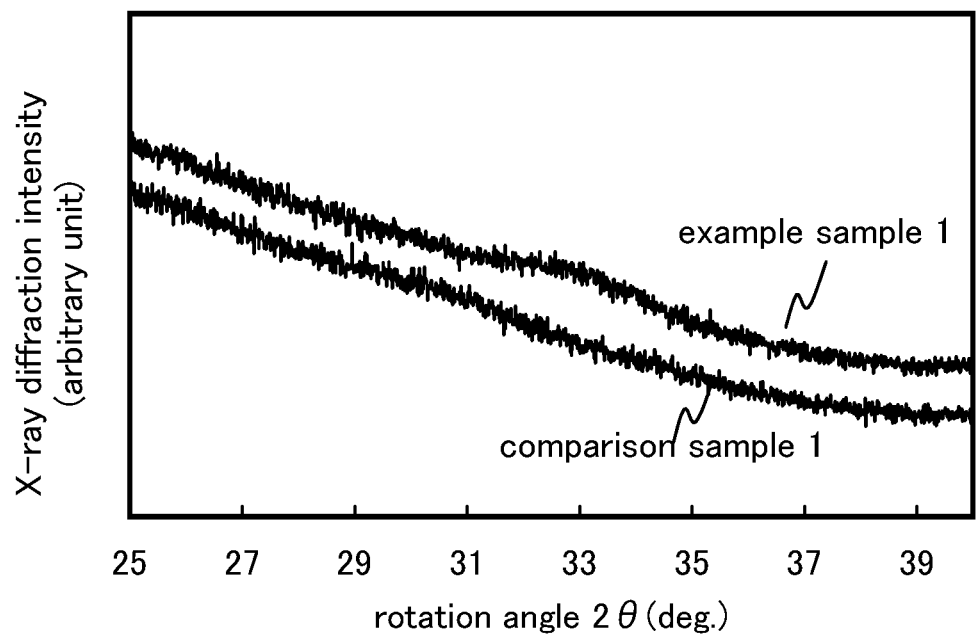
FIGS. 12A and 12B show measurement results of XRD spectra of the samples manufactured in Example.
Figure 12B:
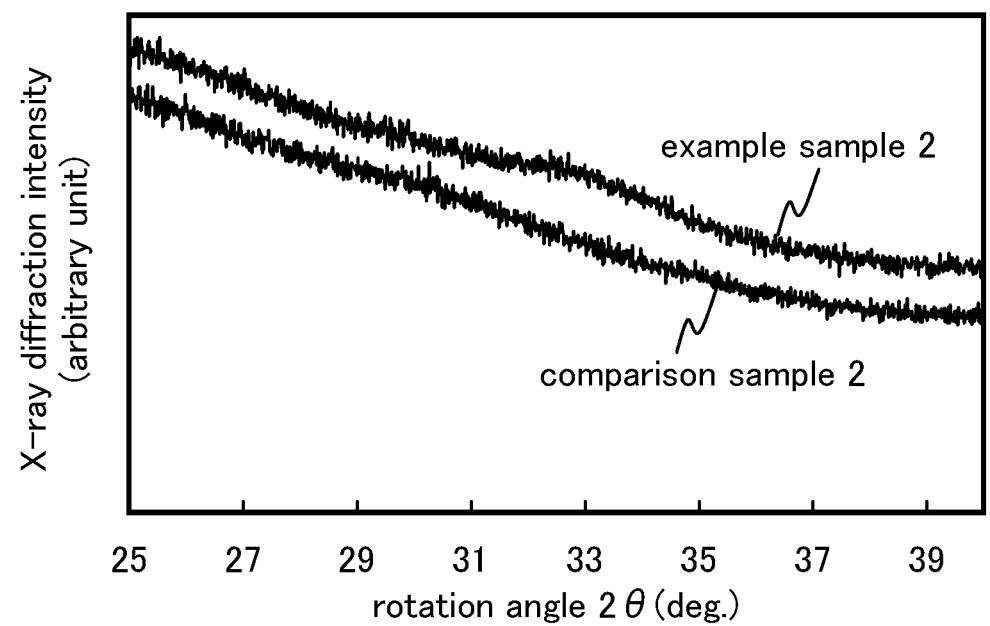

Further, X-ray diffraction (XRD) of the In—Ga—Zn—O film of each of Example Sample 1, Comparison Sample 1, Example Sample 2, and Comparison Sample 2 was measured. FIGS. 12A and 12B show results of the measurement of XRD spectra by an out-of-plane method. FIG. 12A shows results of the measurement of XRD spectra of Example Sample 1 and Comparison Sample 1. FIG. 12B shows results of the measurement of XRD spectra of Example Sample 2 and Comparison Sample 2. In each of FIGS. 12A and 12B, the vertical axis represents the X-ray diffraction intensity (arbitrary unit) and the horizontal axis represents the rotation angle 2θ (degree). Note that the XRD spectra were measured with an X-ray diffractometer D8 ADVANCE manufactured by Bruker AXS.

According to FIG. 12A, the peak derived from a crystal of Example Sample 1 is observed at around 2θ=33 deg. According to FIG. 12B, the peak derived from a crystal of Example Sample 2 is observed at around 2θ=33 deg.

In XRD measurement, even when an oxide semiconductor layer includes a crystal region, a distinct peak is not observed in some cases if the crystallinity is not sufficient. However, the peaks derived from crystals of Example Sample 1 and Example Sample 2, which were subjected to the nitrogen plasma treatment, can be observed according to FIGS. 12A and 12B, which means that the nitrogen plasma treatment is effective in improving crystallinity.

EXAMPLE 2

In this example, analysis results of composition of surfaces of crystalline oxide semiconductor layers subjected to nitrogen plasma treatment will be described using comparison examples.

Methods of manufacturing Example Sample 3, Example Sample 4, and Comparison Samples 3 to 5 will be described below.

For each of the samples in this example, a silicon oxide film was formed to a thickness of 300 nm over a glass substrate by a sputtering method, and an In—Ga—Zn—O film was formed to a thickness of 20 nm over the silicon oxide film.

For each of the samples, the silicon oxide film was formed under the following conditions: the target was a silicon oxide ($SiO_2$) target, the distance between the glass substrate and the target was 60 mm, the pressure was 0.4 Pa, the power of an RF power source was 1.5 kW, the atmosphere was a mixed atmosphere of argon and oxygen (the argon flow rate was 25 sccm and the oxygen flow rate was 25 sccm), and the substrate temperature was 100° C.

Further, the In—Ga—Zn—O film was formed under the following conditions: the target was an oxide target having a composition ratio of $In_2O_3:Ga_2O_3:ZnO=1:1:2$ [molar ratio], the distance between the glass substrate and the target was 60 mm, the pressure was 0.4 Pa, the power of an RF power source was 0.5 kW, the atmosphere was a mixed atmosphere of argon and oxygen (the argon flow rate was 30 sccm and the oxygen flow rate was 15 sccm), and the substrate temperature was 250° C.

Nitrogen treatment using high-density plasma was performed on the formed In—Ga—Zn—O film, so that Example Sample 3 and Example Sample 4 were manufactured. The high-density plasma treatment was performed for 300 seconds under the following conditions: the atmosphere was a mixed atmosphere of argon and nitrogen (the argon flow rate was 1000 sccm and the nitrogen flow rate was 200 sccm), the reaction pressure was 40 Pa, the microwave power output was 3000 W, and the microwave frequency was 2.45 GHz. The substrate temperature for Example Sample 3 was 350° C. and the substrate temperature for Example Sample 4 was 450° C.

Oxygen treatment using high-density plasma, instead of the nitrogen treatment, was performed on the formed In—Ga—Zn—O films, so that Comparison Sample 3 and Comparison Sample 4 were manufactured. For each of Comparison Sample 3 and Comparison Sample 4, the high-density plasma treatment was performed for 300 seconds under the following conditions: the atmosphere was an atmosphere of argon and oxygen (the argon flow rate was 900 sccm and the nitrogen flow rate was 5 sccm), the reaction pressure was 106 Pa, the microwave power output was 3800 W, and the microwave frequency was 2.45 GHz. The substrate temperature for Comparison Sample 3 was 350° C. and the substrate temperature for Comparison Sample 4 was 450° C.

A sample in which plasma treatment was not performed on the In—Ga—Zn—O film was manufactured as Comparison Sample 5.

The composition of a surface of the In—Ga—Zn—O film of each of Example Sample 3, Example Sample 4, and Comparison Samples 3 to 5 obtained through the above steps was quantified by X-ray photoelectron spectroscopy (XPS) analysis and evaluated.

Table 1 shows results of the XPS analysis.

TABLE 1

|  | In | Ga | Zn | O | N |
|---|---|---|---|---|---|
| Example Sample 3 | 14.2 | 23.2 | 2.0 | 39.6 | 21.0 |
| Example Sample 4 | 11.4 | 24.6 | 1.7 | 38.8 | 23.5 |
| Comparison Sample 3 | 14.9 | 15.1 | 9.7 | 60.2 | 0.0 |
| Comparison Sample 4 | 14.7 | 14.5 | 9.8 | 60.9 | 0.0 |
| Comparison Sample 5 | 14.7 | 14.8 | 9.5 | 61.0 | 0.0 |

According to Table 1, there is no significant difference in the composition ratio of In to Ga, Zn, and O between Comparison Sample 5 which was not subjected to plasma treatment and Comparison Samples 3 and 4 which were subjected to the oxygen plasma treatment. In contrast, in Example Sample 3 and Example Sample 4 which were subjected to the nitrogen plasma treatment, Zn and O in the composition ratio are reduced, and Ga and N in the composition ratio are increased. The reduction and increase observed in Example Sample 4 are more noticeable than those observed in Example Sample 3.

Figure 13:
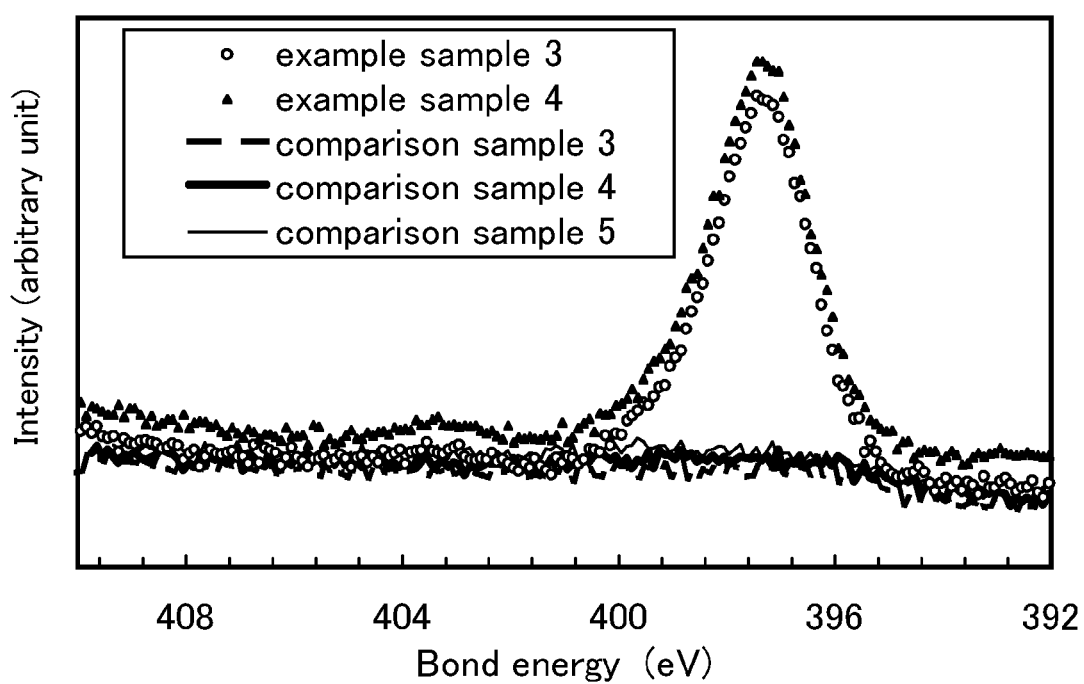
FIG. 13 shows measurement results of XPS spectra of samples manufactured in Example.

FIG. 13 shows spectra obtained by the XPS analysis. In FIG. 13, the horizontal axis represents the bond energy of N-1s and the vertical axis represents the spectrum intensity. Since the peak position of the spectrum obtained by XPS analysis is determined depending on the electron states of elements, the peak position depends on the bonding state. From the XPS spectra of N-1s shown in FIG. 13, the bonding state of N can be known.

In FIG. 13, a peak derived from the bond between a metal element and a nitrogen element in each of Example Sample 3 and Example Sample 4 after being subjected to the nitrogen plasma treatment was observed. Further, the peak in Example Sample 4 subjected to the nitrogen plasma treatment at high temperature was higher than that in Example Sample 3.

The results show that the surface of the In—Ga—Zn—O film was nitrided by performing the nitrogen plasma treatment on the In—Ga—Zn—O film. The results also show that the higher the temperature of the nitrogen plasma treatment is, the higher the degree of nitridation is.

This application is based on Japanese Patent Application serial no. 2011-130367 filed with the Japan Patent Office on Jun. 10, 2011, the entire contents of which are hereby incorporated by reference.

What is claimed is:

1. A semiconductor device comprising:
a c-axis aligned crystalline oxide semiconductor layer including indium, gallium, and zinc, the crystalline oxide semiconductor layer comprising a source region, a drain region, and a channel formation region;
a gate insulating layer over the channel formation region; and
a gate electrode over the channel formation region with the gate insulating layer positioned therebetween,
wherein the source region and the drain region are crystalline regions containing nitrogen.

2. The semiconductor device according to claim 1, wherein the source region and the drain region have higher crystallinity than the channel formation region.

3. The semiconductor device according to claim 1, wherein the gate electrode contains nitrogen.

4. The semiconductor device according to claim 1, wherein the gate insulating layer does not overlap with the source region or the drain region.

5. The semiconductor device according to claim 1, wherein the source region and the drain region have higher carrier density than the channel formation region.

6. The semiconductor device according to claim 1, wherein the gate insulating layer includes hafnium oxide, yttrium oxide, hafnium silicate, hafnium silicate to which nitrogen is added, hafnium aluminate, or lanthanum oxide.

7. A semiconductor device comprising:
a c-axis aligned crystalline oxide semiconductor layer including indium, gallium, and zinc, the crystalline oxide semiconductor layer comprising a source region, a drain region, and a channel formation region;
a gate insulating layer over the channel formation region;
a gate electrode over the channel formation region with the gate insulating layer positioned therebetween;
an insulating layer having openings and positioned over the crystalline oxide semiconductor layer and the gate electrode; and
a source electrode and a drain electrode respectively in contact with the source region and the drain region through the openings in the insulating layer,
wherein the source region and the drain region are crystalline regions containing nitrogen.

8. The semiconductor device according to claim 7, wherein the source region and the drain region have higher crystallinity than the channel formation region.

9. The semiconductor device according to claim 7, wherein the gate electrode contains nitrogen.

10. The semiconductor device according to claim 7, wherein the gate insulating layer does not overlap with the source region or the drain region.

11. The semiconductor device according to claim 7, wherein the source region and the drain region have higher carrier density than the channel formation region.

12. The semiconductor device according to claim 7, wherein the gate insulating layer includes hafnium oxide, yttrium oxide, hafnium silicate, hafnium silicate to which nitrogen is added, hafnium aluminate, or lanthanum oxide.

* * * * *